US012751020B2

(12) United States Patent
Lee et al.

(10) Patent No.: US 12,751,020 B2
(45) Date of Patent: Sep. 29, 2026

(54) BONDED SEMICONDUCTOR MEMORY DEVICE

(71) Applicant: SAMSUNG ELECTRONICS CO., LTD., Suwon-si (KR)

(72) Inventors: Hongjun Lee, Suwon-si (KR); Keunnam Kim, Suwon-si (KR); Hui-Jung Kim, Suwon-si (KR); Seokhan Park, Suwon-si (KR); Kiseok Lee, Suwon-si (KR); Moonyoung Jeong, Suwon-si (KR); Jay-Bok Choi, Suwon-si (KR); Hyungeun Choi, Suwon-si (KR); Jinwoo Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 348 days.

(21) Appl. No.: 18/370,940

(22) Filed: Sep. 21, 2023

(65) Prior Publication Data

US 2024/0268129 A1 Aug. 8, 2024

(30) Foreign Application Priority Data

Feb. 2, 2023 (KR) ........................ 10-2023-0014463

(51) Int. Cl.

| | |
|---|---|
| ***H10B 80/00*** | (2026.01) |
| ***H10W 80/00*** | (2026.01) |
| ***H10W 90/00*** | (2026.01) |
| ***H10W 90/20*** | (2026.01) |

(52) U.S. Cl.

CPC ............ *H10B 80/00* (2023.02); *H10W 90/00* (2026.01); *H10W 80/312* (2026.01); *H10W 80/327* (2026.01); *H10W 90/297* (2026.01); *H10W 90/792* (2026.01)

(58) Field of Classification Search

CPC .... H10B 80/00; H10W 90/00; H10W 90/297; H10W 90/792; H10W 80/312; H10W 80/327

USPC .......................................................... 257/777

See application file for complete search history.

(56) References Cited

U.S. PATENT DOCUMENTS

| | | | |
|---|---|---|---|
| 10,903,216 B2 | 1/2021 | Kim et al. | |
| 11,569,243 B2 | 1/2023 | Sharma et al. | |
| 2015/0021789 A1 | 1/2015 | Lin | |
| 2020/0279863 A1* | 9/2020 | Liu | H10B 43/10 |

(Continued)

FOREIGN PATENT DOCUMENTS

| | | |
|---|---|---|
| KR | 10-1120676 B1 | 3/2012 |
| KR | 20230011538 A1 | 1/2023 |

*Primary Examiner* — Eric W Jones

(74) *Attorney, Agent, or Firm* — Muir Patent Law, PLLC

(57) ABSTRACT

Disclosed are semiconductor devices and their fabrication methods. The semiconductor device comprises a lower substrate, a lower dielectric structure on the lower substrate, a memory cell structure between the lower substrate and the lower dielectric structure, a lower bonding pad in the lower dielectric structure, an upper dielectric structure on the lower dielectric structure, an upper substrate on the upper dielectric structure, a transistor between the upper substrate and the upper dielectric structure, and an upper bonding pad in the upper dielectric structure. A top surface of the lower bonding pad is in contact with a bottom surface of the upper bonding pad. The lower bonding pad and the upper bonding pad overlap the memory cell structure.

20 Claims, 31 Drawing Sheets

(56) References Cited

U.S. PATENT DOCUMENTS

| | | | |
|---|---|---|---|
| 2021/0118988 A1* | 4/2021 | Gan | H10B 43/40 |
| 2021/0265295 A1 | 8/2021 | Liu et al. | |
| 2022/0208735 A1 | 6/2022 | Yu et al. | |
| 2022/0216239 A1 | 7/2022 | Yoo et al. | |

* cited by examiner

BONDED SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2023-0014463 filed on Feb. 2, 2023 in the Korean Intellectual Property Office, the disclosure of which is hereby incorporated by reference in its entirety.

BACKGROUND

1. Field

Embodiments relate to a semiconductor device, and more particularly, to a semiconductor device including a bonding pad.

2. Description of the Related Art

A semiconductor device includes an integrated circuit consisting of metal oxide semiconductor field effect transistors (MOSFETs). As size and design rule of the semiconductor device have gradually decreased, sizes of the MOSFETs are also being increasingly scaled down. Scale downed of MOSFETs could deteriorate operating characteristics of a semiconductor device. Accordingly, research has been variously developed to manufacture a semiconductor device having excellent performance while overcoming limitations due to integration of the semiconductor device.

SUMMARY

Embodiments may provide a semiconductor device whose electrical properties are improved.

According to some embodiments, a semiconductor device may include a lower substrate, a lower dielectric structure on the lower substrate, a memory cell structure between the lower substrate and the lower dielectric structure, a lower bonding pad in the lower dielectric structure; an upper dielectric structure on the lower dielectric structure, an upper substrate on the upper dielectric structure, a transistor between the upper substrate and the upper dielectric structure and an upper bonding pad in the upper dielectric structure. A top surface of the lower bonding pad may be in contact with a bottom surface of the upper bonding pad, and the lower bonding pad and the upper bonding pad may overlap the memory cell structure.

According to some embodiments, a semiconductor device may comprise: a lower bonding structure that includes a lower substrate, a, a memory cell structure between the lower substrate and the lower dielectric structure, and a first lower bonding pad in the lower dielectric structure. The first lower bonding pad may be in contact with the first upper bonding pad. The first transistor may overlap the memory cell structure. The first transistor may be electrically connected to the memory cell structure through the first upper bonding pad and the first lower bonding pad.

According to some embodiments, a semiconductor device may comprise: a lower substrate; a lower dielectric structure on the lower substrate; a memory cell structure between the lower substrate and the lower dielectric structure, wherein the memory cell structure includes a bit line; an upper dielectric structure on the lower dielectric structure; an upper substrate on the upper dielectric structure; a transistor between the upper substrate and the upper dielectric structure; a connection dielectric structure on the upper substrate; a connection conductive structure in the connection dielectric structure; a lower bonding pad and an upper bonding pad that electrically connect the transistor to the bit line, wherein the lower bonding pad and the upper bonding pad are in contact with each other; and a through via that electrically connects the transistor to the connection conductive structure. The transistor, the upper bonding pad, and the lower bonding pad may overlap the memory cell structure. The through via may penetrate the upper substrate.

According to some embodiments, a method of fabricating a semiconductor device may comprise: forming on a lower substrate a memory cell structure including a bit line; forming a lower dielectric structure that covers the memory cell structure; forming a lower bonding pad in the lower dielectric structure; forming a transistor on an upper substrate; forming an upper dielectric structure that covers the transistor; forming an upper bonding pad in the upper dielectric structure; and bonding the upper dielectric structure to the lower dielectric structure and bonding the upper bonding pad to the lower bonding pad. The upper bonding pad and the lower bonding pad may overlap the memory cell structure.

BRIEF DESCRIPTION OF DRAWINGS

Features will become apparent to those of skill in the art by describing in detail exemplary embodiments with reference to the attached drawings in which.

DETAILED DESCRIPTION

A semiconductor device according to some embodiments will be discussed in conjunction with the accompanying drawings.

Figure 1A:
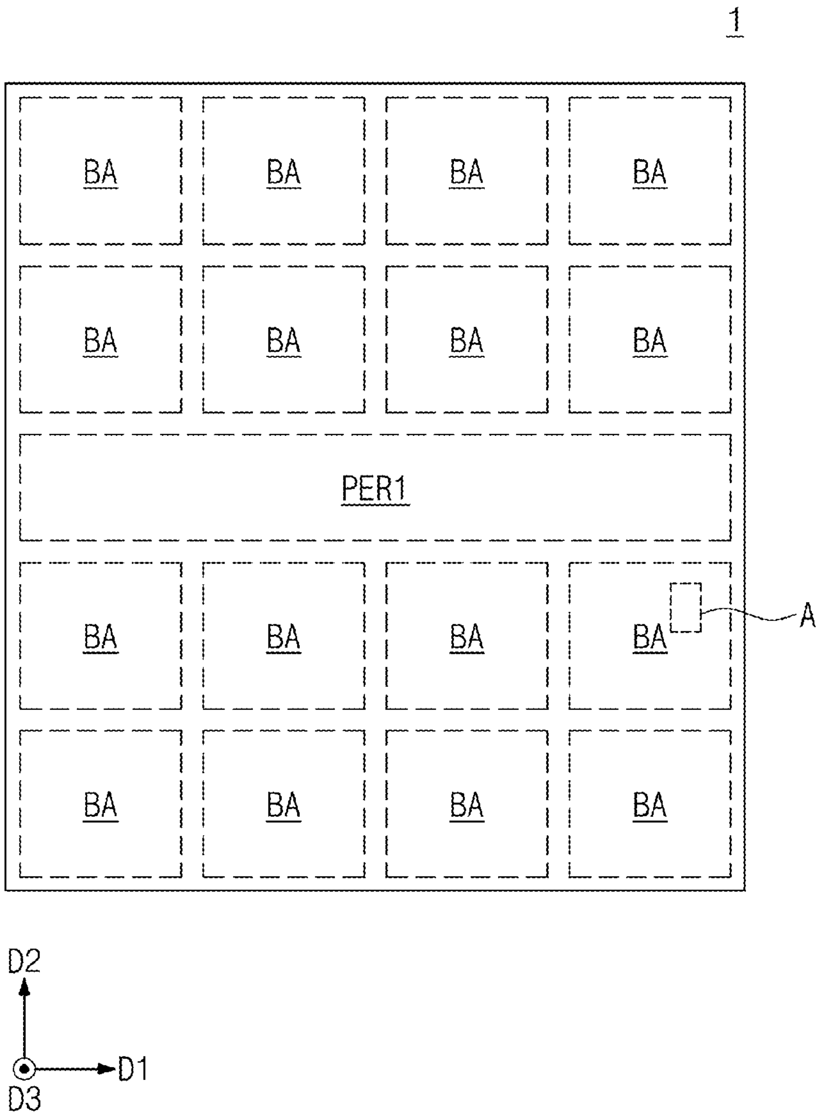
FIG. 1A illustrates a plan view showing a semiconductor device according to some embodiments.
Figure 1B:
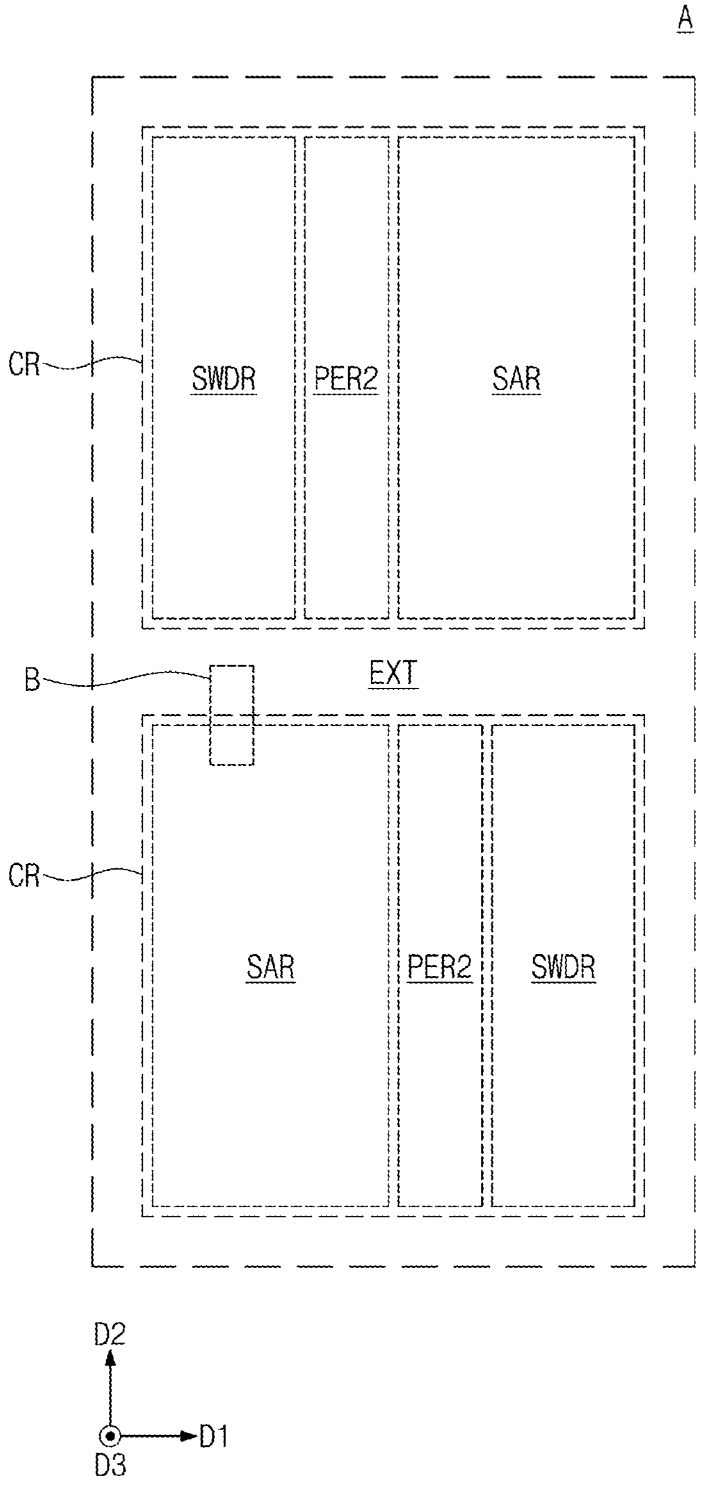
FIG. 1B illustrates an enlarged view showing section A of FIG. 1A.
Figure 1C:
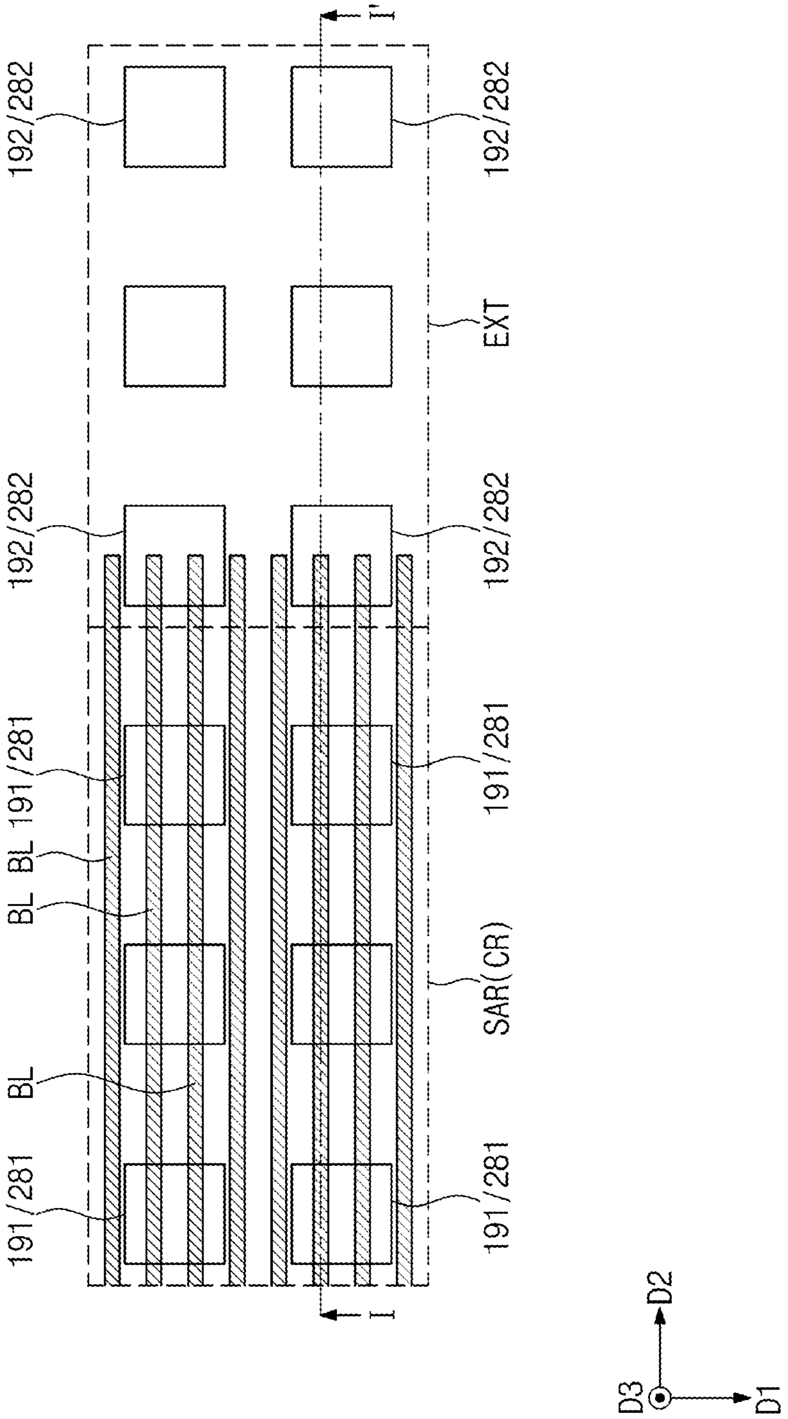
FIG. 1C illustrates an enlarged view showing section B of FIG. 1B.
Figure 1D:
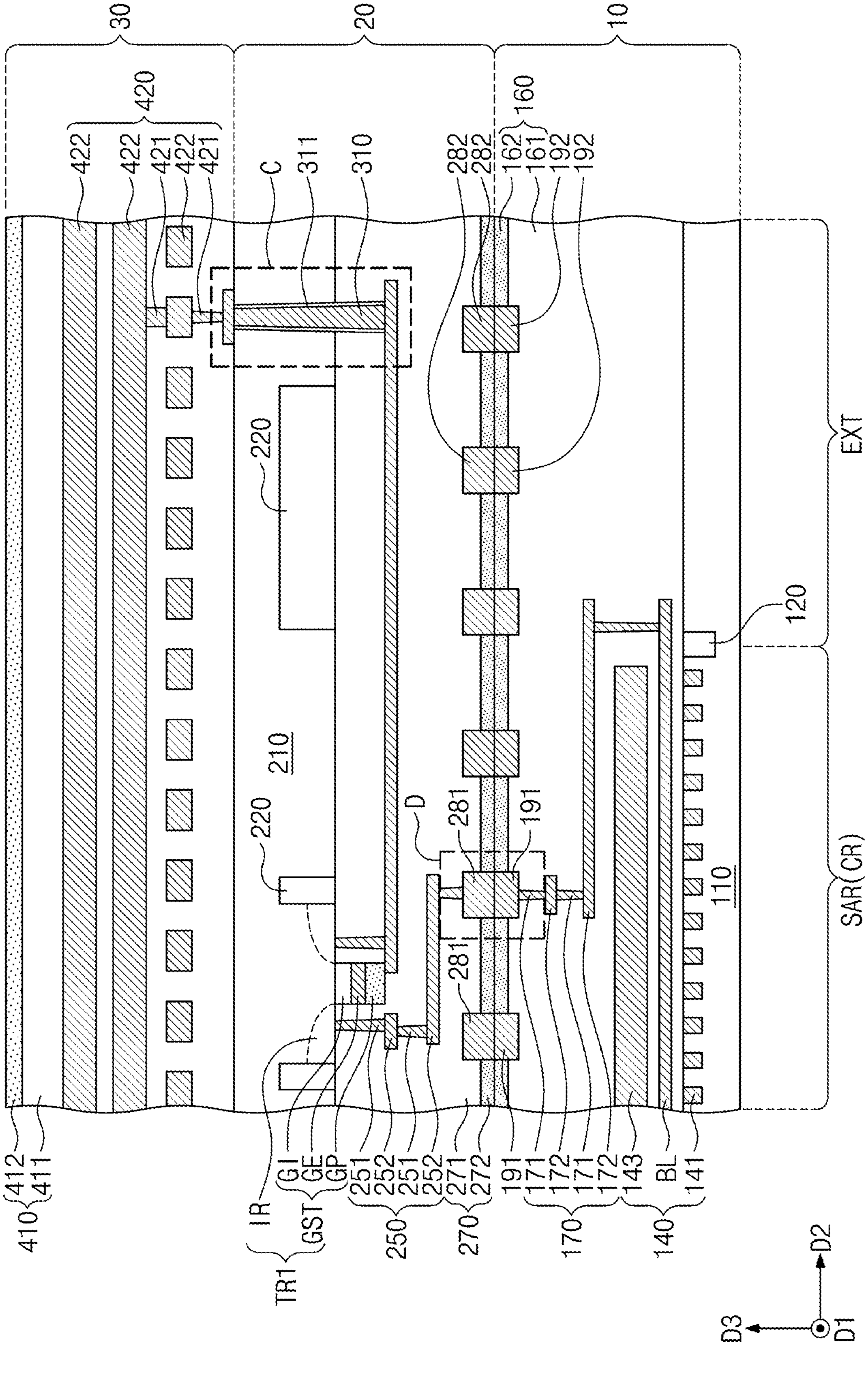
FIG. 1D illustrates a cross-sectional view taken along line I-I' of FIG. 1C.
Figure 1E:
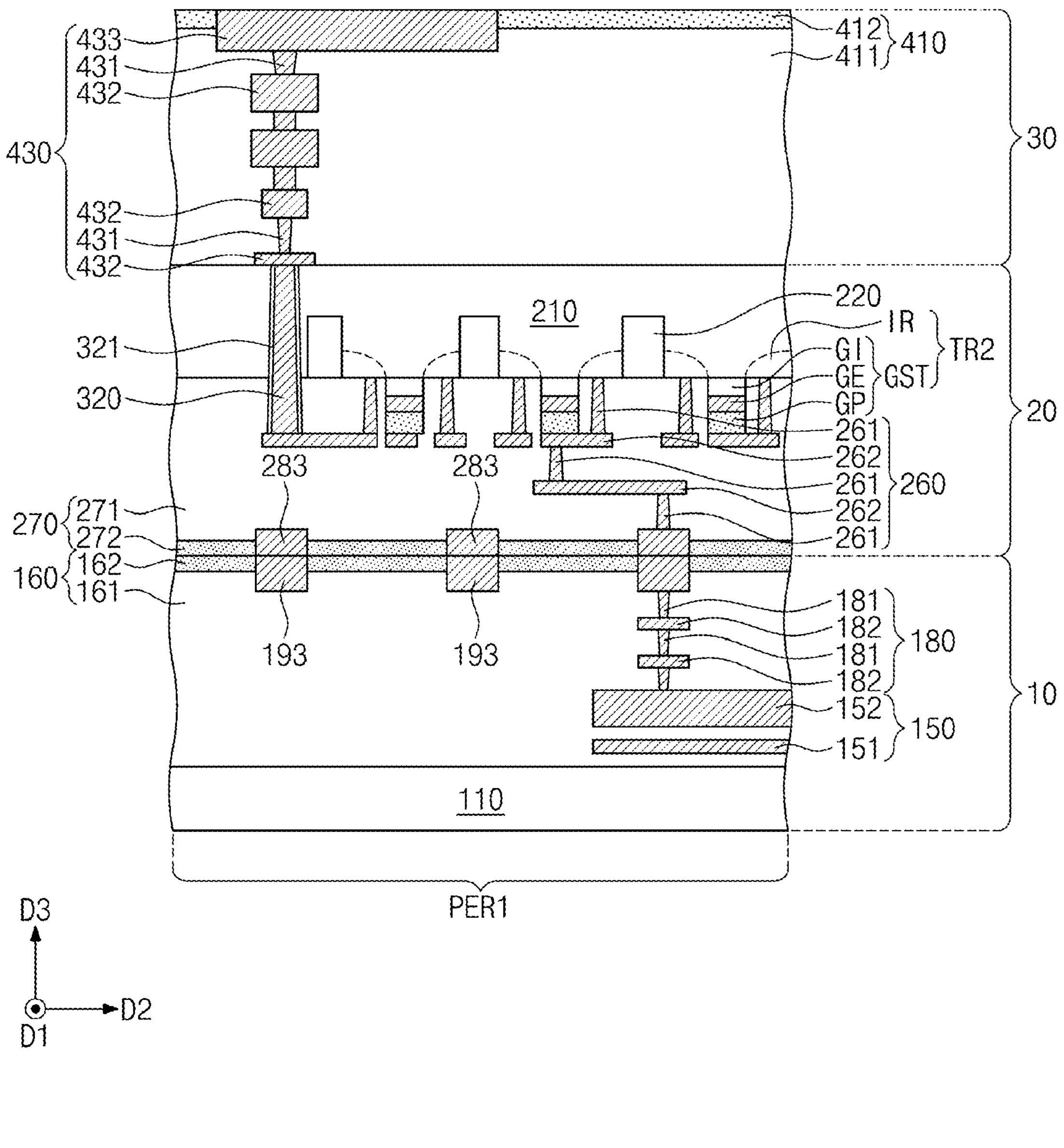
FIG. 1E illustrates a cross-sectional view showing a first peripheral region of FIG. 1A.
Figure 1F:
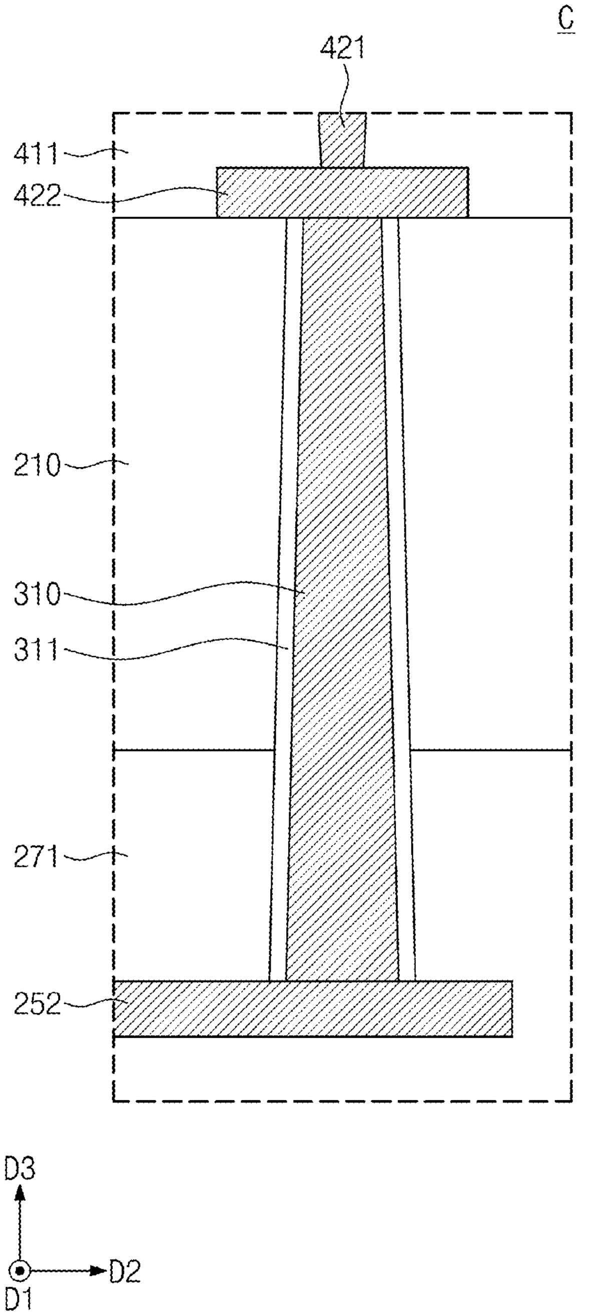
FIG. 1F illustrates an enlarged view showing section C of FIG. 1D.
Figure 1G:
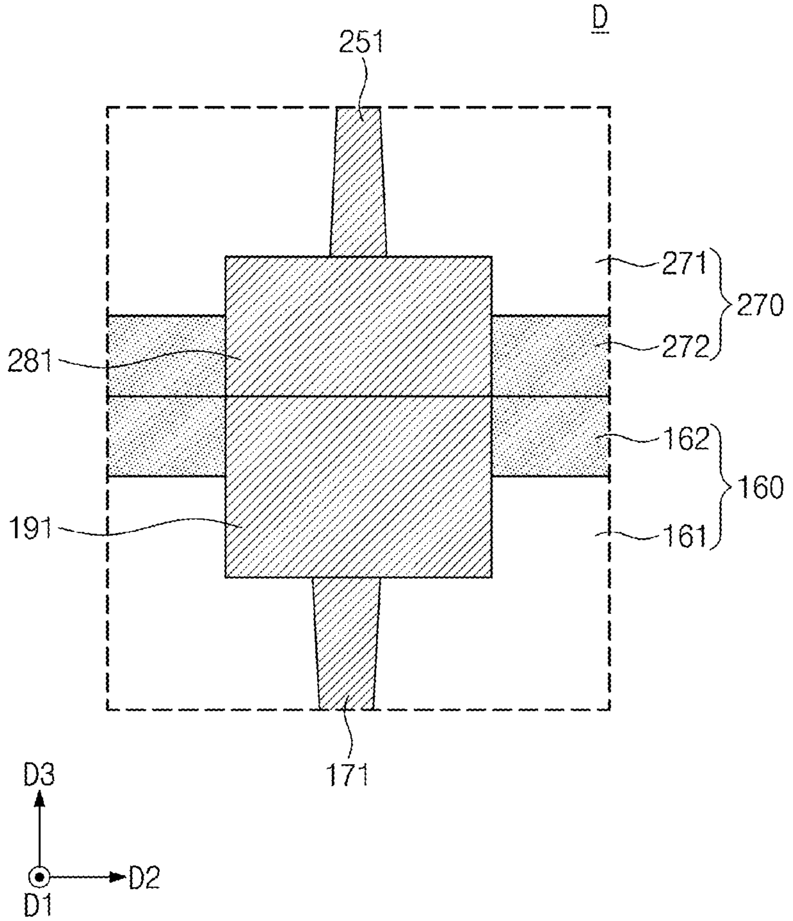
FIG. 1G illustrates an enlarged view showing section D of FIG. 1D.

FIG. 1A illustrates a plan view showing a semiconductor device according to some embodiments. FIG. 1B illustrates an enlarged view showing section A of FIG. 1A. FIG. 1C illustrates an enlarged view showing section B of FIG. 1B. FIG. 1D illustrates a cross-sectional view taken along line I-I' of FIG. 1C. FIG. 1E illustrates a cross-sectional view showing a first peripheral region of FIG. 1A. FIG. 1F illustrates an enlarged view showing section C of FIG. 1D. FIG. 1G illustrates an enlarged view showing section D of FIG. 1D.

Referring to FIGS. 1A and 1B, a semiconductor device 1 may include a plurality of banks BA and a first peripheral region PER1. The first peripheral region PER1 may be disposed between the banks BA. The first peripheral region PER1 may be provided thereon with peripheral circuits for input/output of data, command, or power/ground.

Each of the banks BA may include cell block regions CR and an extension region EXT between the cell block regions CR. Each of the cell block regions CR may include a sense amplifier region SAR, a second peripheral region PER2, and a sub-word line driver region SWDR. The sense amplifier region SAR may be provided thereon with sense amplifiers. The sub-word line driver region SWDR may be provided thereon with sub-word line drivers.

Referring to FIGS. 1C, 1D, 1E, 1F, and 1G, a semiconductor device 1 may include a lower bonding structure 10, an upper bonding structure 20 on the lower bonding structure 10, and a connection structure 30 on the upper bonding structure 20.

The lower bonding structure 10 may include a lower substrate 110, a first device isolation layer 120, a memory cell structure 140, a power capacitor structure 150, a lower dielectric structure 160, first lower conductive structures 170, second lower conductive structures 180, first lower bonding pads 191, second lower bonding pads 192, and third lower bonding pads 193.

The lower substrate 110 may have a plate shape that extends along a plane defined by a first direction D1 and a second direction D2. The first direction D1 and the second direction D2 may intersect each other. For example, the first direction D1 and the second direction D2 may be horizontal directions that are orthogonal to each other. In some embodiments, the lower substrate 110 may be a semiconductor substrate. For example, the lower substrate 110 may include silicon, germanium, silicon-germanium, gallium-phosphorus, or gallium-arsenic. In some embodiments, the lower substrate 110 may be a silicon-on-insulator (SOI) substrate or a germanium-on-insulator (GOI) substrate.

A first device isolation layer 120 may be provided in the lower substrate 110. The first device isolation layer 120 may include a dielectric material.

The lower dielectric structure 160 may cover the memory cell structure 140 and the power capacitor structure 150. The memory cell structure 140 and the power capacitor structure 150 may be disposed between the lower substrate 110 and the lower dielectric structure 160. The lower dielectric structure 160 may include a first lower dielectric layer 161 and a second lower dielectric layer 162. The second lower dielectric layer 162 may be provided on the first lower dielectric layer 161. The first lower dielectric layer 161 and the second lower dielectric layer 162 may include different dielectric materials from each other. For example, the first lower dielectric layer 161 may include a $SiO_2$ layer, and the second lower dielectric layer 162 may include a SiCN layer and a SiCON layer.

In some embodiments, the first lower dielectric layer 161 may be a multiple dielectric layer including a plurality of dielectric layers. In some embodiments, the first lower dielectric layer 161 and the second lower dielectric layer 162 may include the same dielectric material. For example, the first and second lower dielectric layers 161 and 162 may include a $SiO_2$ layer.

The memory cell structure 140 may include cell gate structures 141, bit lines BL, and a cell capacitor 143. The memory cell structure 140 may be disposed on the cell block region CR. The memory cell structure 140 may be disposed on the sense amplifier region SAR, the second peripheral region PER2, and the sub-word line driver region SWDR. The memory cell structure 140 may be located at a level lower than that of the sensor amplifier and the sub-word line driver. The memory cell structure 140 may overlap in a third direction D3 with the sensor amplifier and the sub-word line driver. The memory cell structure 140 may overlap in the third direction D3 with a first transistor TR1 which will be discussed below. The third direction D3 may intersect the first direction D1 and the second direction D2. For example, the third direction D3 may be a vertical direction that is perpendicular to the first direction D1 and the second direction D2.

The cell gate structures 141 may extend in the first direction D1. The cell gate structures 141 may be arranged in the second direction D2. The cell gate structures 141 may be buried in the lower substrate 110.

The bit lines BL may extend in the second direction D2. The bit lines BL may be arranged in the first direction D1. The bit line BL may include a conductive material. The bit line BL may be disposed between the cell gate structure 141 and the cell capacitor 143.

The cell capacitor 143 may store data. The cell capacitor 143 may be electrically connected to the lower substrate 110.

The power capacitor structure 150 may be located at the same level as that of the memory cell structure 140. The power capacitor structure 150 may include a power capacitor conductive line 151 and a power capacitor 152. The power capacitor structure 150 may be disposed on the first peripheral region PER1. At least a portion of second transistors TR2, which will be discussed below, may overlap in the third direction D3 with the power capacitor structure 150.

The power capacitor conductive line 151 may be located at the same level as that of the bit line BL. The power capacitor 152 may be located at the same level as that of the cell capacitor 143. The power capacitor 152 may have a similar structure to that of the cell capacitor 143.

The first lower conductive structures 170 and the second lower conductive structures 180 may be disposed in the first lower dielectric layer 161 of the lower dielectric structure 160. The first lower conductive structures 170 may include first lower contacts 171 and first lower conductive lines 172. A conductive material may be included in the first lower contacts 171 and the first lower conductive lines 172 of the first lower conductive structures 170. The first lower contacts 171 and the first lower conductive lines 172 of the first lower conductive structures 170 may be disposed on the cell block region CR and the extension region EXT. At least a portion of the first lower conductive lines 172 may extend from the extension region EXT toward the sense amplifier region SAR. The first lower contact 171 may have a width that decreases as a level of the first lower contact 171 becomes lower.

The first lower conductive structures 170 may electrically connect the first lower bonding pad 191 to the bit line BL of the memory cell structure 140.

The second lower conductive structures 180 may include second lower contacts 181 and second lower conductive lines 182. A conductive material may be included in the second lower contacts 181 and the second lower conductive lines 182 of the second lower conductive structures 180. The second lower contacts 181 and the second lower conductive lines 182 of the second lower conductive structures 180 may be disposed on the first peripheral region PER1. The second lower contact 181 may have a width that decreases as a level of the second lower contact 181 becomes lower.

The second lower conductive structures 180 may electrically connect the third lower bonding pad 193 to the power capacitor 152 of the power capacitor structure 150.

The first lower bonding pads 191 may be defined to indicate lower bonding pads that are disposed in the cell block region CR. The first lower bonding pads 191 may be disposed in the sense amplifier region SAR, the sub-word line driver region SWDR, and the second peripheral region PER2. The second lower bonding pads 192 may be defined to indicate lower bonding pads disposed on the extension region EXT. The third lower bonding pads 193 may be defined to indicate lower bonding pads disposed on the first peripheral region PER1.

The first, second, and third lower bonding pads 191, 192, and 193 may be provided in the lower dielectric structure 160. The first, second, and third lower bonding pads 191, 192, and 193 may be located at a level higher than that of the first and second lower conductive structures 170 and 180. The first, second, and third lower bonding pads 191, 192, and 193 may have top surfaces that are coplanar with surfaces of the lower dielectric structure 160. The first, second, and third lower bonding pads 191, 192, and 193 may penetrate the second lower dielectric layer 162. The first, second, and third lower bonding pads 191, 192, and 193 may include a conductive material. For example, the first, second, and third lower bonding pads 191, 192, and 193 may include copper. The first, second, and third lower bonding pads 191, 192, and 193 may each have a tetragonal shape when viewed in a plan view.

The upper bonding structure 20 may include an upper substrate 210, second device isolation layers 220, first transistors TR1, second transistors TR2, first upper conductive structures 250, second upper conductive structures 260, an upper dielectric structure 270, first upper bonding pads 281, second upper bonding pads 282, and third upper bonding pads 283.

The first transistor TR1 and the second transistors TR2 may be provided on a bottom surface of the upper substrate 210. The first transistor TR1 and the second transistors TR2 may be disposed between the upper substrate 210 and the upper dielectric structure 270. Each of the first and second transistors TR1 and TR2 may include impurity regions IR, and may also include a channel and a gate structure GST between the impurity regions IR.

The upper substrate 210 may be implanted with impurities to form the impurity regions IR. The gate structure GST may include a gate dielectric layer GI, a gate electrode GE on the gate dielectric layer GI, and a gate capping layer GP on the gate electrode GE. The gate dielectric layer GI and the gate capping layer GP may include a dielectric material. The gate electrode GE may include a conductive material.

The first transistor TR1 may be disposed on the sense amplifier region SAR of the cell block region CR. The first transistor TR1 may be a transistor that constitutes the sense amplifier. The second transistor TR2 may be disposed on the first peripheral region PER1. In some embodiments, the first transistor TR1 may be a transistor that is disposed on the sub-word line driver region SWDR of the cell block region CR and that constitutes the sub-word line driver. The first transistor TR1 that constitutes the sub-word line driver may be electrically connected to the cell gate structure 141 of the memory cell structure 140.

The upper dielectric structure 270 may cover the first and second transistors TR1 and TR2. The upper dielectric structure 270 may be provided on the lower dielectric structure 160. The upper substrate 210 may be provided on the upper dielectric structure 270. The upper dielectric structure 270 may include a first upper dielectric layer 271 and a second upper dielectric layer 272. The second upper dielectric layer 272 may be provided on the second lower dielectric layer 162, and the first upper dielectric layer 271 may be provided on the second upper dielectric layer 272. The first and second upper dielectric layers 271 and 272 may include different dielectric materials from each other. For example, the first upper dielectric layer 271 may include a $SiO_2$ layer, and the second upper dielectric layer 272 may include a SiCN layer and a SiCON layer.

In some embodiments, the first upper dielectric layer 271 may be a multiple dielectric layer including a plurality of dielectric layers. In some embodiments, the first and second upper dielectric layers 271 and 272 may include the same dielectric material. For example, the first and second upper dielectric layers 271 and 272 may both include a $SiO_2$ layer.

The first upper conductive structures 250 and the second upper conductive structures 260 may be disposed in the first upper dielectric layer 271 of the upper dielectric structure 270. The first upper conductive structures 250 may be electrically connected to the first transistor TR1. The first upper conductive structures 250 may include first upper contacts 251 and first upper conductive lines 252. A conductive material may be included in the first upper contacts 251 and the first upper conductive lines 252 of the first upper conductive structures 250. The first upper contacts 251 and the first upper conductive lines 252 of the first upper conductive structures 250 may be disposed on the cell block region CR and the extension region EXT. At least a portion of the first upper conductive lines 252 may extend from the extension region EXT toward the sense amplifier region SAR. The first upper contact 251 may have a width that increases as a level of the first upper contact 251 becomes lower.

The second upper conductive structures 260 may be electrically connected to the second transistor TR2. The second upper conductive structures 260 may include second upper contacts 261 and second upper conductive lines 262. A conductive material may be included in the second upper contacts 261 and the second upper conductive lines 262 of the second upper conductive structures 260. The second upper contacts 261 and the second upper conductive lines 262 of the second upper conductive structures 260 may be disposed on the first peripheral region PER1. The second upper contact 261 may have a width that increases as a level of the second upper contact 261 becomes lower.

The first upper bonding pads 281 may be defined to indicate upper bonding pads disposed on the cell block region CR. The first upper bonding pads 281 may be disposed on the sense amplifier region SAR, the sub-word line driver region SWDR, and the second peripheral region PER2. The second upper bonding pads 282 may be defined to indicate upper bonding pads disposed on the extension region EXT. The third upper bonding pads 283 may be defined to indicate upper bonding pads disposed on the first peripheral region PER1.

The first, second, and third upper bonding pads 281, 282, and 283 may be provided in the upper dielectric structure 270. The first, second, and third upper bonding pads 281, 282, and 283 may be located at a level lower than that of the first and second upper conductive structures 250 and 260. The first, second, and third upper bonding pads 281, 282, and 283 may have their bottom surfaces coplanar with that of the upper dielectric structure 270. The first, second, and third upper bonding pads 281, 282, and 283 may penetrate the second upper dielectric layer 272. The first, second, and third upper bonding pads 281, 282, and 283 may include a conductive material. For example, the first, second, and third upper bonding pads 281, 282, and 283 may include copper. The first, second, and third upper bonding pads 281, 282, and 283 may each have a tetragonal shape when viewed in a plan view.

The first upper bonding pad 281 may be electrically connected to the first transistor TR1. For example, the first upper bonding pad 281 may be electrically connected to the first transistor TR1 through the first upper contact 251 and the first upper conductive line 252.

The third upper bonding pad 283 may be electrically connected to the second transistor TR2. The third upper bonding pad 283 may be electrically connected to the second transistor TR2 through the second upper contact 261 and the second upper conductive line 262.

The bottom surface of the first upper bonding pad 281 may be in contact with the top surface of the first lower bonding pad 191. The bottom surface of the second upper bonding pad 282 may be in contact with the top surface of the second lower bonding pad 192. The bottom surface of the third upper bonding pad 283 may be in contact with the top surface of the third lower bonding pad 193.

The bit line BL of the memory cell structure 140 may be electrically connected to the first transistor TR1 through the first lower conductive structures 170, the first lower bonding pad 191, the first upper bonding pad 281, and the first upper conductive structures 250.

In some embodiments, the first transistor TR1 may be a transistor that is disposed on the sub-word line driver region SWDR of the cell block region CR and that constitutes the sub-word line driver. The cell gate structure 141 may be electrically connected to the first transistor TR1 through the first lower conductive structures 170, the first lower bonding pad 191, the first upper bonding pad 281, and the first upper conductive structures 250.

The power capacitor 152 of the power capacitor structure 150 may be electrically connected to the second transistor TR2 through the second lower conductive structures 180, the third lower bonding pad 193, the third upper bonding pad 283, and the second upper conductive structures 260.

The first upper bonding pads 281 and the first lower bonding pads 191 may overlap in the third direction D3 with the memory cell structure 140. A portion of the third upper bonding pads 283 and a portion of the third lower bonding pads 193 may overlap in the third direction D3 with the power capacitor structure 150.

A first through via 310 and a first through dielectric layer 311 that surrounds the first through via 310 may be provided. The first through via 310 and the first through dielectric layer 311 may each have a width that increases with decreasing distance from the lower substrate 110. The width of each of the first through via 310 and the first through dielectric layer 311 may increase as a level of the first through via 310 becomes lower. For example, a width in the second direction D2 of each of the first through via 310 and the first through dielectric layer 311 may increase as a level of the first through via and a level of the first through dielectric layer becomes lower. The first through via 310 may include a conductive material. The first through dielectric layer 311 may include a dielectric material.

The first through via 310 and the first through dielectric layer 311 may extend in the third direction D3. The first through via 310 and the first through dielectric layer 311 may be disposed on the extension region EXT. The first through via 310 and the first through dielectric layer 311 may penetrate the upper substrate 210 to come into connection with the first upper conductive line 252 disposed at the top of the first upper conductive structures 250. The first through via 310 may be electrically connected to the first transistor TR1 through the first upper conductive line 252 and the first upper contact 251.

A second through via 320 and a second through dielectric layer 321 that surrounds the second through via 320 may be provided. The second through via 320 and the second through dielectric layer 321 may each have a width that increases with decreasing distance from the lower substrate 110. The width of each of the second through via 320 and the second through dielectric layer 321 may increase as a level of the second through via 320 becomes lower. For example, a width in the second direction D2 of each of the second through via 320 and the second through dielectric layer 321 may increase as a level of the second through via 320 and the second through dielectric layer 321 becomes lower. The second through via 320 may include a conductive material. The second through dielectric layer 321 may include a dielectric material.

The second through via 320 and the second through dielectric layer 321 may extend in the third direction D3. The second through via 320 and the second through dielectric layer 321 may be disposed in the first peripheral region PER1. The second through via 320 and the second through dielectric layer 321 may penetrate the upper substrate 210 to come into connection with the second upper conductive line 262 disposed at the top of the second upper conductive structures 260. The second through via 320 may be electrically connected to the second transistor TR2 through the second upper conductive line 262 and the second upper contact 261.

The connection structure 30 may include a connection dielectric structure 410, first connection conductive structures 420, and second connection conductive structures 430. The connection dielectric structure 410 may include a first connection dielectric layer 411 on the upper substrate 210 and a second connection dielectric layer 412 on the first connection dielectric layer 411. The first and second connection dielectric layers 411 and 412 may include different dielectric materials from each other. For example, the first connection dielectric layer 411 may include a $SiO_2$ layer, and the second connection dielectric layer 412 may include a silicon nitride layer.

In some embodiments, the first connection dielectric layer 411 may be a multiple dielectric layer including a plurality of dielectric layers. In some embodiments, the first and second connection dielectric layers 411 and 412 may include the same dielectric material. For example, the first and second connection dielectric layers 411 and 412 may include a $SiO_2$ layer.

The first connection conductive structures 420 and the second connection conductive structures 430 may be disposed in the first connection dielectric layer 411 of the connection dielectric structure 410. The first connection conductive structures 420 may include first connection contacts 421 and first connection conductive lines 422. A conductive material may be included in the first connection contacts 421 and the first connection conductive lines 422 of the first connection conductive structures 420. The first connection contacts 421 may each have a width that decreases as a level of the first connection contacts 422 becomes lower.

The first connection conductive line 422 disposed at the bottom of the first connection conductive structures 420 may be connected to the first through via 310. The first connection conductive structures 420 may be electrically connected to the first transistor TR1 through the first through via 310 and the first upper conductive structures 250.

The second connection conductive structures 430 may include second connection contacts 431, second connection conductive lines 432, and terminals 433. A conductive material may be included in the second connection contacts 431, the second connection conductive lines 432, and the terminals 433 of the second connection conductive structures 430. The first peripheral region PER1 may be provided thereon with the second connection contacts 431, the second connection conductive lines 432, and the terminals 433 of the second connection conductive structures 430. The second connection contacts 431 may each have a width that decreases as a level becomes lower.

The second connection conductive line 432 disposed at the bottom of the second connection conductive structures 430 may be connected to the second through via 320. The second connection conductive structures 430 may be electrically connected to the second transistor TR2 through the second through via 320 and the second upper conductive structures 260. The semiconductor device 1 may be electrically connected through the terminal 433 to an external apparatus.

Referring to FIG. 1C, in the sense amplifier region SAR, the number of the first upper bonding pads 281 arranged along the second direction D2 may be related to a pitch in the first direction D1 of the first upper bonding pads 281 and a pitch in the first direction D1 of the bit lines BL. In some embodiments, the number of the first upper bonding pads 281 arranged in the second direction D2 may be the same as or greater than the number of the bit lines BL arranged on the sense amplifier region SAR in the first direction D1 within the pitch in the first direction D1 of the first upper bonding pads 281. For example, when four bit lines BL are arranged in the first direction D1 within the pitch in the first direction D1 of the first upper bonding pads 281 on the sense amplifier region SAR, the number of the first upper bonding pads 281 arranged in the second direction D2 may be equal to or greater than 4.

In some embodiments, the number of the first upper bonding pads 281 disposed on the sense amplifier region SAR may be greater than a value obtained by dividing a length in the first direction D1 of the cell block region CR by a pitch in the first direction D1 of the bit lines BL.

In some embodiments, when the pitch in the first direction D1 of the first upper bonding pads 281 is an integer times (N1 times) a pitch in the first direction D1 of a unit sense amplifier, and when a length in the second direction D2 of the sense amplifier region SAR is an integer times (N2 times) a pitch in the second direction D2 of the unit sense amplifier, the number of the first upper bonding pads 281 arranged in the second direction D2 on the sense amplifier region SAR may be equal to or less than N1×N2.

In some embodiments, a value equal or less than about 1 μm may be given to the pitch in the first direction D1 of the first upper bonding pads 281.

In a semiconductor device according to some embodiments, transistors that constitute a sense amplifier and a sub-word line driver may be disposed to overlap a memory cell structure. Therefore, it may be possible to provide a relatively large size for the transistors that constitute the sense amplifier and the sub-word line driver to reduce the cost of fabrication for the transistors, and to increase electrical properties of the transistors. In addition, integration of the semiconductor device may be improved to allow the semiconductor device to have a relatively small size.

A semiconductor device according to some embodiments may include bonding pads. Thus, a memory cell structure and a transistor that overlap each other may be electrically connected to each other.

Figure 2A:
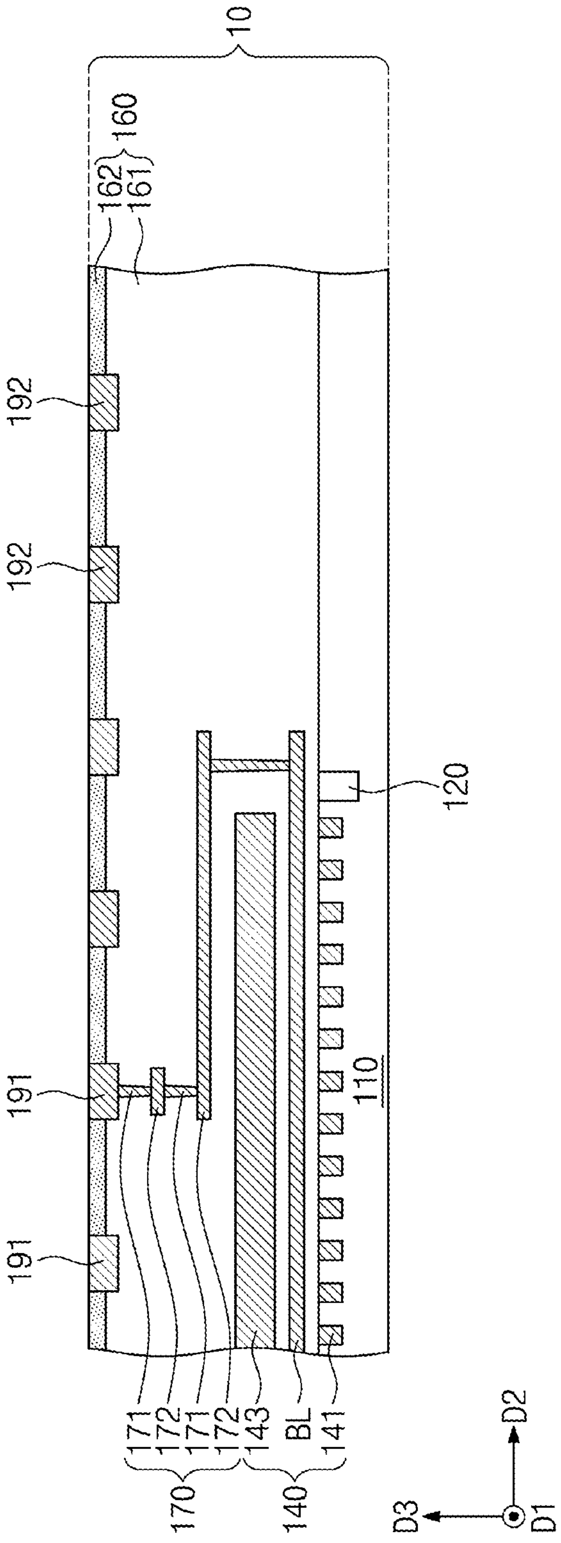
FIGS. 2A, 2B, 3A, 3B, 4A, and 4B illustrate cross-sectional views showing a method of fabricating a semiconductor device according to some embodiments.
Figure 2B:
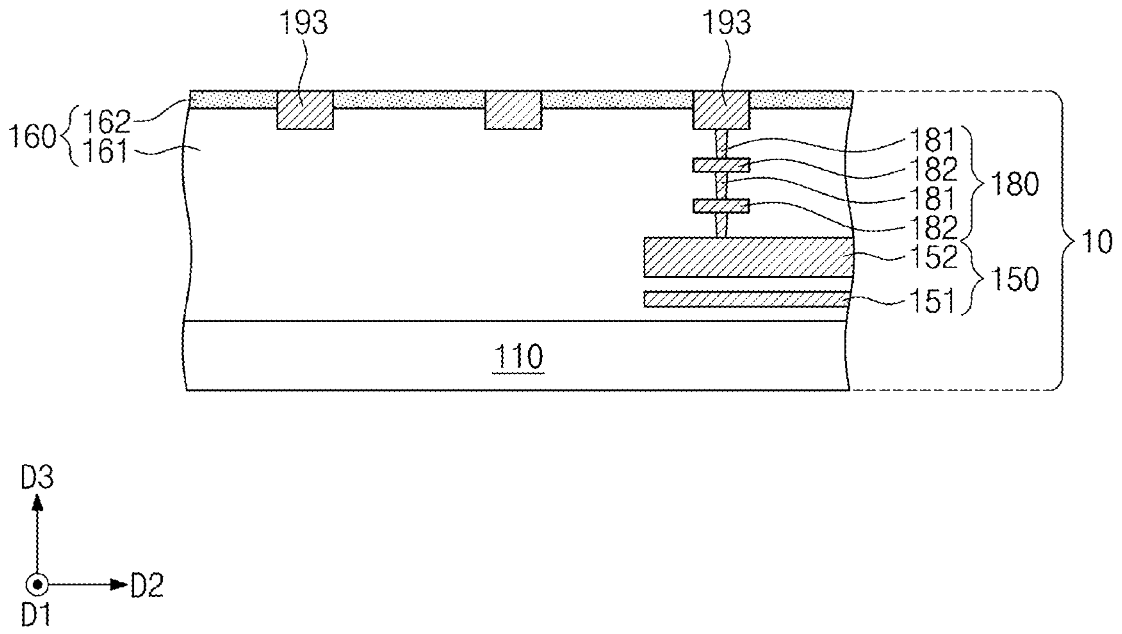
Figure 3A:
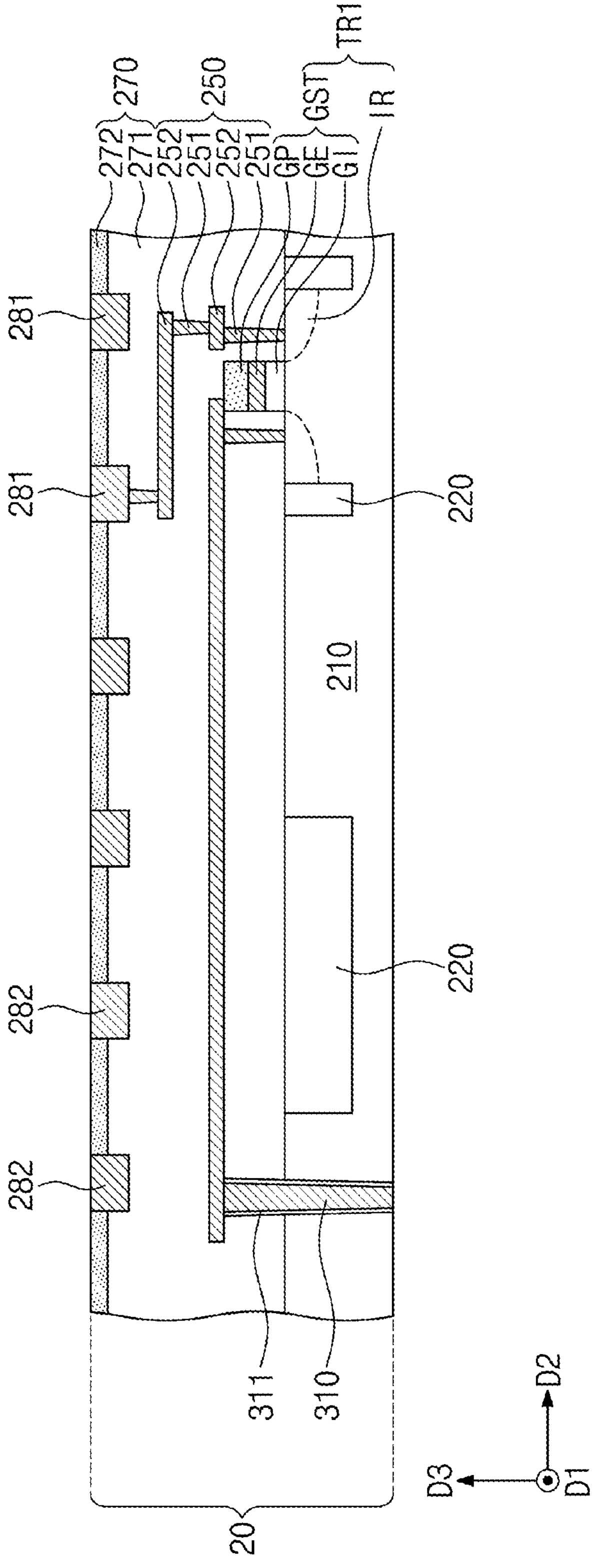
Figure 3B:
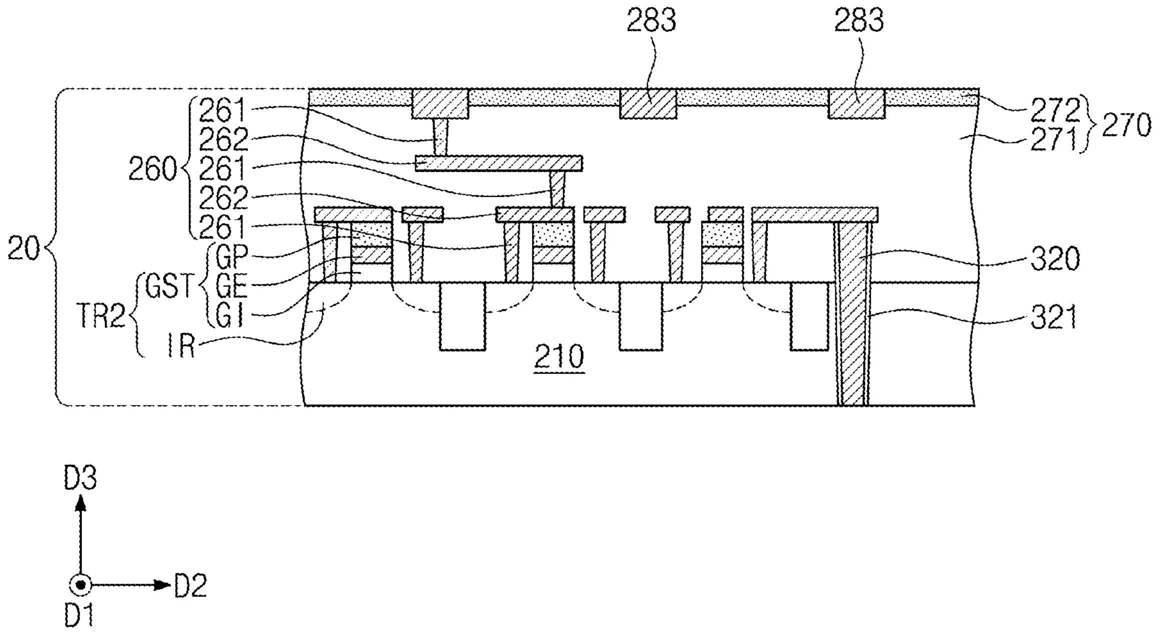
Figure 4A:
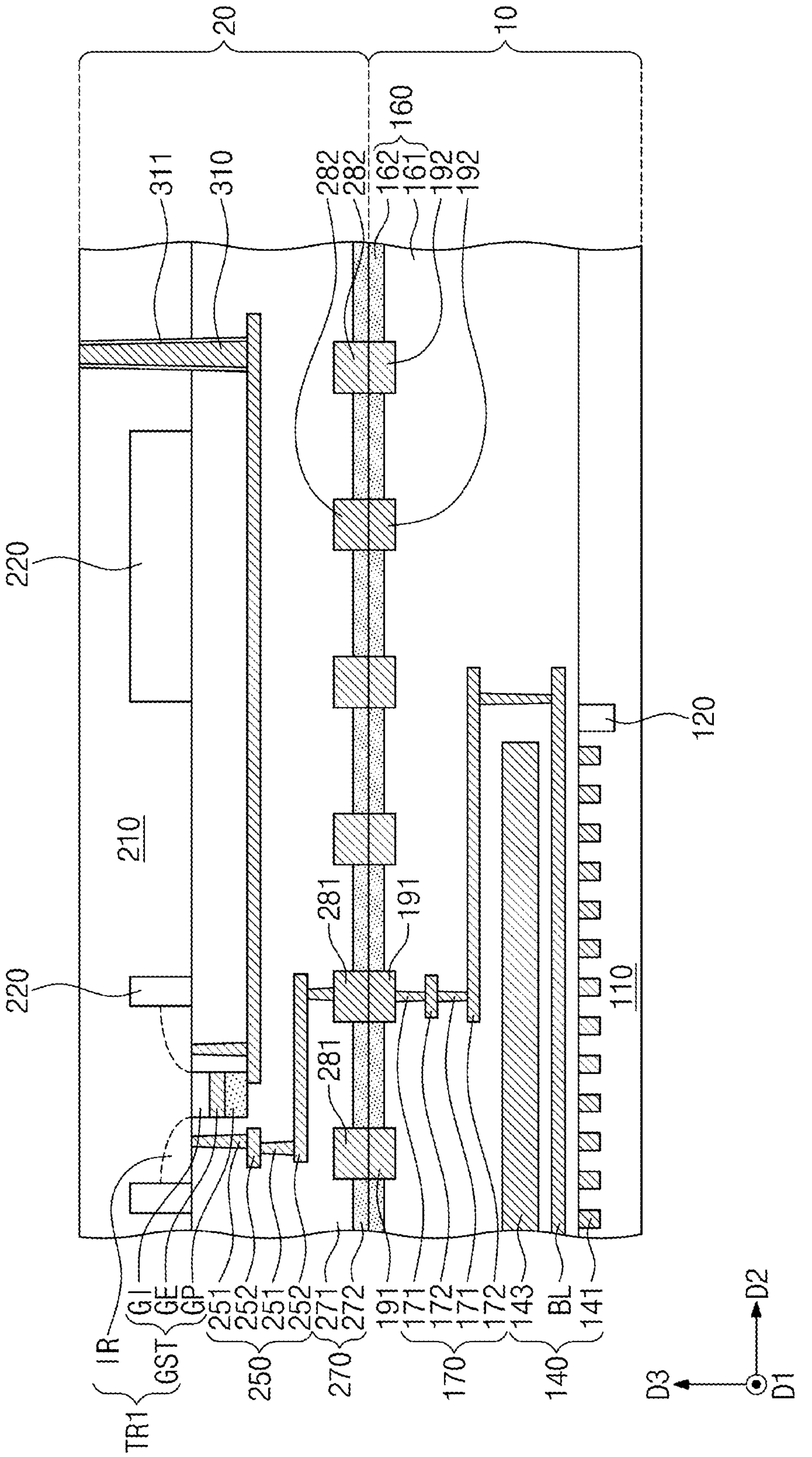

FIGS. 2A, 2B, 3A, 3B, 4A, and 4B illustrate cross-sectional views showing a method of fabricating a semiconductor device according to some embodiments. FIGS. 2A, 3A, and 4A may correspond to FIG. 1D and FIGS. 2B, 3B, and 4B may correspond to FIG. 1E.

Referring to FIGS. 2A and 2B, a lower bonding structure 10 may be formed. A first device isolation layer 120 may be formed in a lower substrate 110.

A memory cell structure 140 may be formed on the lower substrate 110. A power capacitor structure 150 may be formed on the lower substrate 110. A lower dielectric structure 160 may be formed to cover the memory cell structure 140 and the power capacitor structure 150. First lower conductive structures 170 and second lower conductive structures 180 may be formed in the lower dielectric structure 160.

First lower bonding pads 191, second lower bonding pads 192, and third lower bonding pads 193 may be formed in the lower dielectric structure 160. The formation of the first, second, and third lower bonding pads 191, 192, and 193 may include forming empty spaces in the lower dielectric structure 160, and filling the empty spaces with the first, second, and third lower bonding pads 191, 192, and 193.

Referring to FIGS. 3A and 3B, an upper bonding structure 20 may be formed. Second device isolation layers 220 may be formed in an upper substrate 210. A first transistor TR1 and second transistors TR2 may be formed on the upper substrate 210. First and second through vias 310 and 320 and first and second through dielectric layers 311 and 321 may be formed to penetrate the upper substrate 210. First upper conductive structures 250, second upper conductive structures 260, and an upper dielectric structure 270 may be formed on the upper substrate 210.

First upper bonding pads 281, second upper bonding pads 282, and third upper bonding pads 283 may be formed in the upper dielectric structure 270. The formation of the first, second, and third upper bonding pads 281, 282, and 283 may include forming empty spaces in the upper dielectric structure 270, and filling the empty spaces with the first, second, and third upper bonding pads 281, 282, and 283.

Figure 4B:
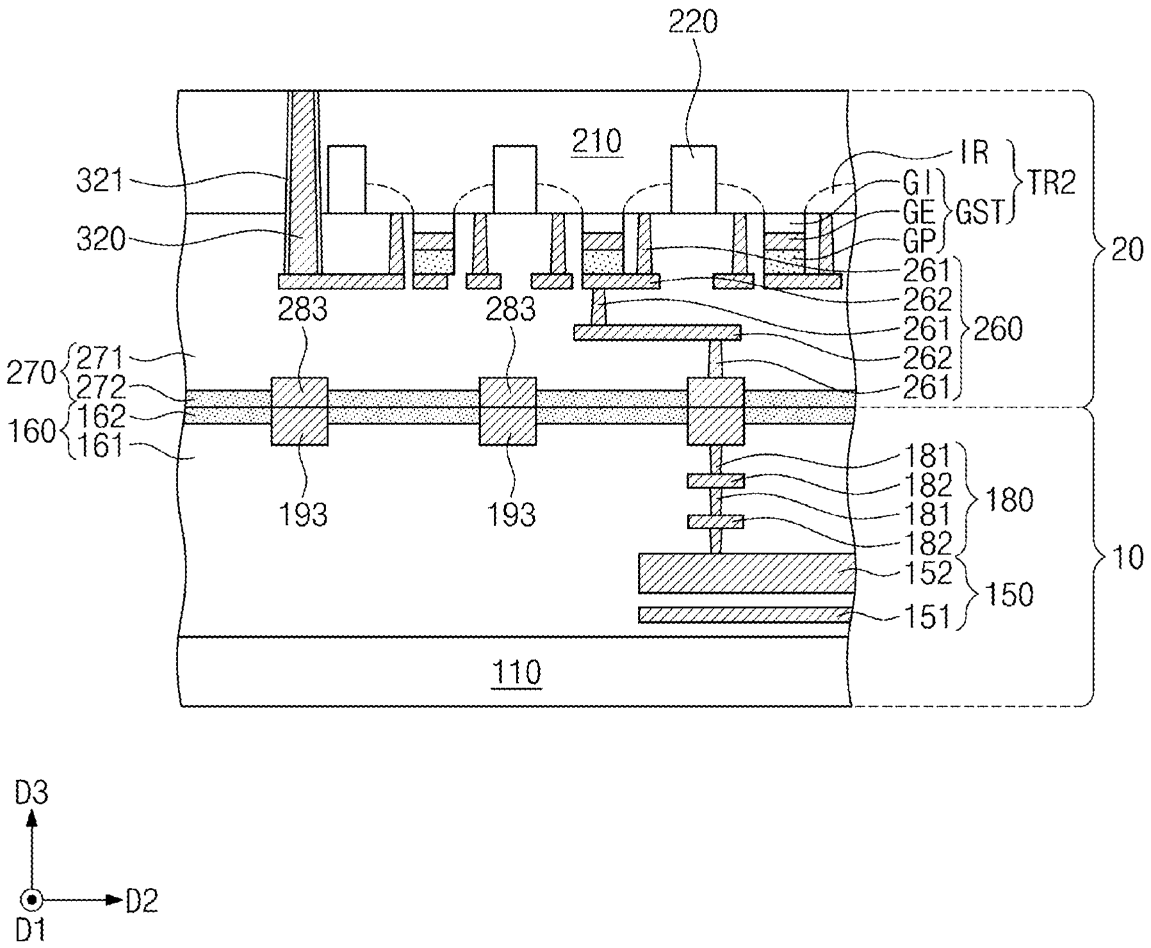

Referring to FIGS. 4A and 4B, the upper bonding structure 20 may be turned upside down and bonded to the lower bonding structure 10. A hybrid bonding process may be employed to bond the upper bonding structure 20 to the lower bonding structure 10. The first, second, and third upper bonding pads 281, 282, and 283 may be respectively bonded to the first, second, and third lower bonding pads 191, 192, and 193. A second lower dielectric layer 162 of the lower dielectric structure 160 may be bonded to a second upper dielectric layer 272 of the upper dielectric structure 270.

Referring to FIGS. 1D and 1E, a connection dielectric structure 410 may be formed on the upper substrate 210. First connection conductive structures 420 and second connection conductive structures 430 may be formed in the connection dielectric structure 410.

Figure 5A:
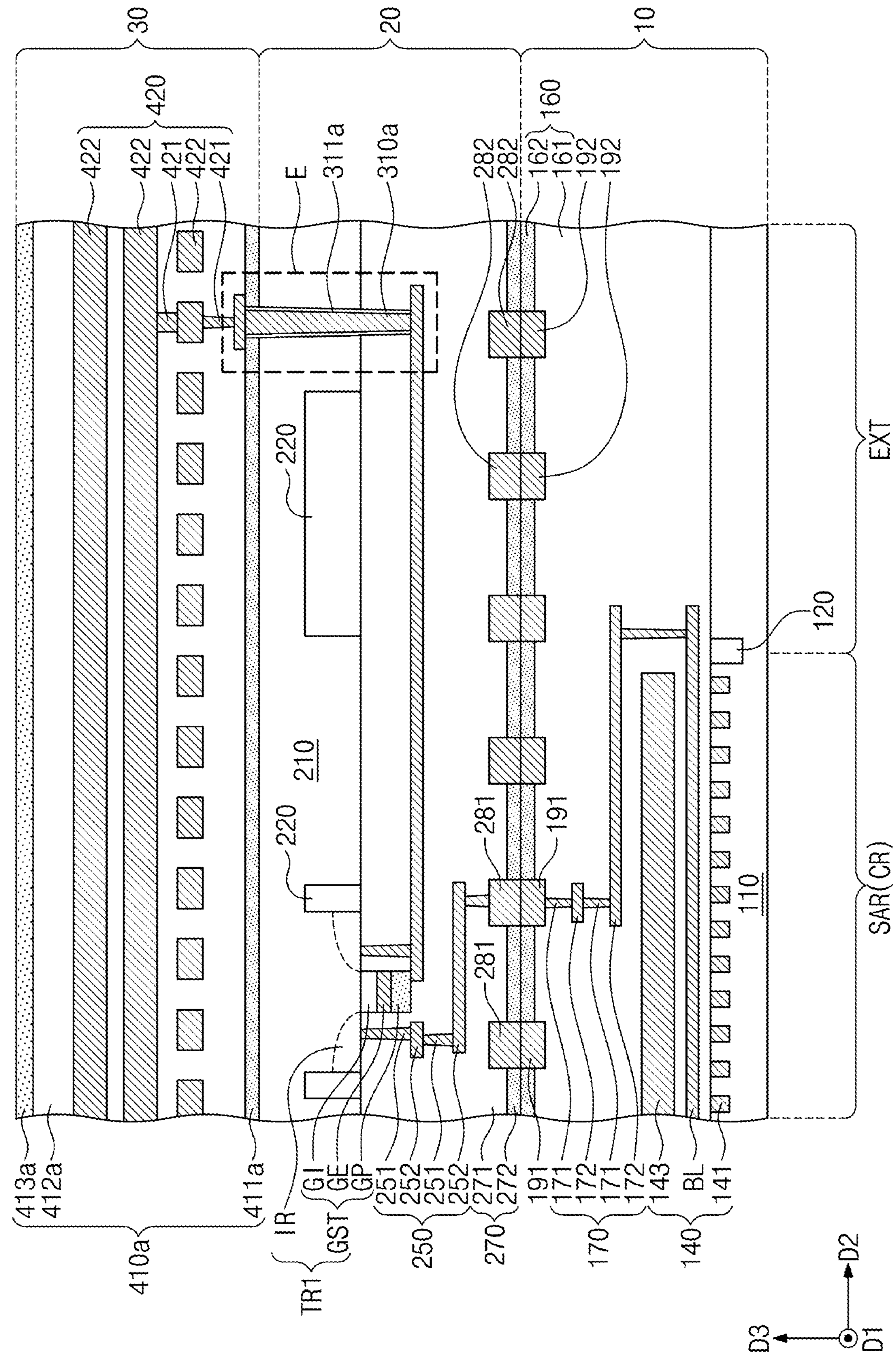
FIGS. 5A and 5B illustrate cross-sectional views showing a semiconductor device according to some embodiments.
Figure 5B:
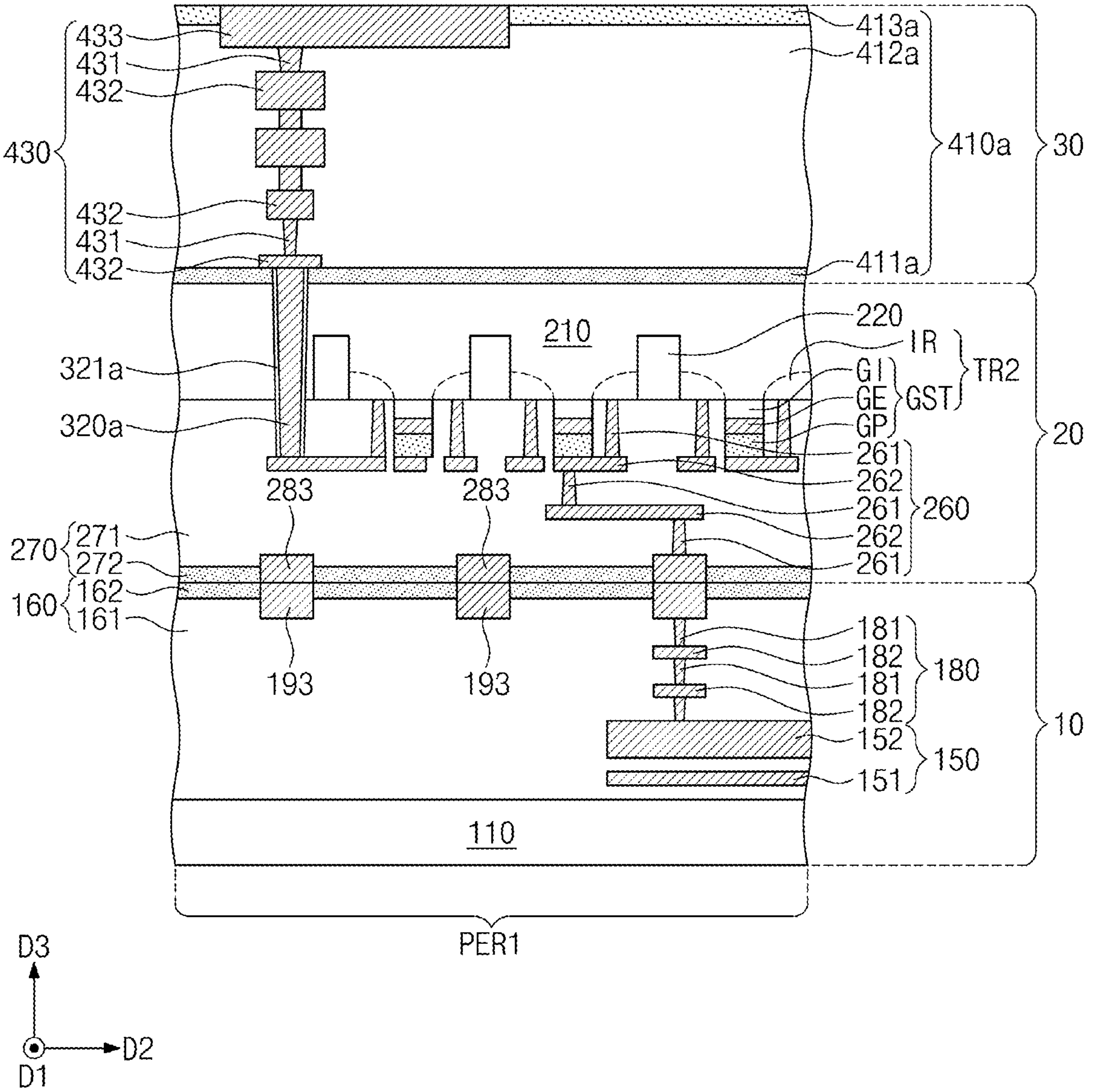
Figure 5C:
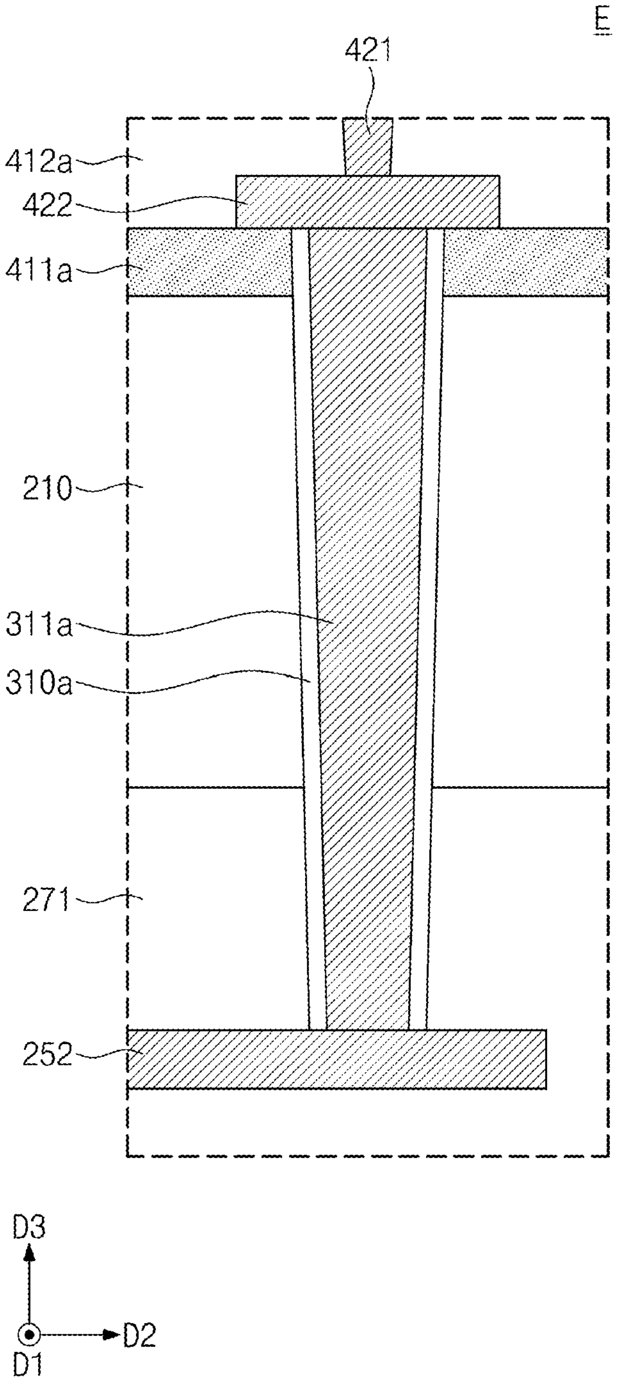
FIG. 5C illustrates an enlarged view showing section E of FIG. 5A.

FIGS. 5A and 5B illustrate cross-sectional views showing a semiconductor device according to some embodiments. FIG. 5C illustrates an enlarged view showing section E of FIG. 5A. A semiconductor device according to FIGS. 5A, 5B, and 5C may be similar to that according to FIGS. 1A to 1G, except the following description.

Referring to FIGS. 5A, 5B, and 5C, a semiconductor device may include a lower bonding structure 10, an upper bonding structure 20 on the lower bonding structure 10, and a connection structure 30 on the upper bonding structure 20.

A connection dielectric structure 410*a* of the connection structure 30 may include a first connection dielectric layer 411*a* on the upper substrate 210, a second connection dielectric layer 412*a* on the first connection dielectric layer 411*a*, and a third connection dielectric layer 413*a* on the second connection dielectric layer 412*a*. The first and third connection dielectric layers 411*a* and 413*a* may include a dielectric material different from that of the second connection dielectric layer 412*a*. For example, the first and third connection dielectric layers 411*a* and 413*a* may include a silicon nitride layer, and the second connection dielectric layer 412*a* may include a $SiO_2$ layer.

A first through via 310*a*, a first through dielectric layer 311*a* that surrounds the first through via 310*a*, a second through via 320*a*, and a second through dielectric layer 321*a* that surrounds the second through via 320*a* may penetrate the upper substrate 210 and the first connection dielectric layer 411*a*. The first and second through vias 310*a* and 320*a* and the first and second through dielectric layers 311*a* and 321*a* may each have a width that decreases as a level of the first and second dielectric layers 311*a* and 3211 becomes lower. The first and second through vias 310*a* and 320*a* and the first and second through dielectric layers 311*a* and 321*a* may have their top surfaces coplanar with that of the first connection dielectric layer 411*a*.

A first connection conductive line 422 disposed at the bottom of the first connection conductive structures 420 and a second connection conductive line 432 disposed at the bottom of the second connection conductive structures 430 may have their bottom surfaces in contact with the top surface of the first connection dielectric layer 411*a*.

Figure 6A:
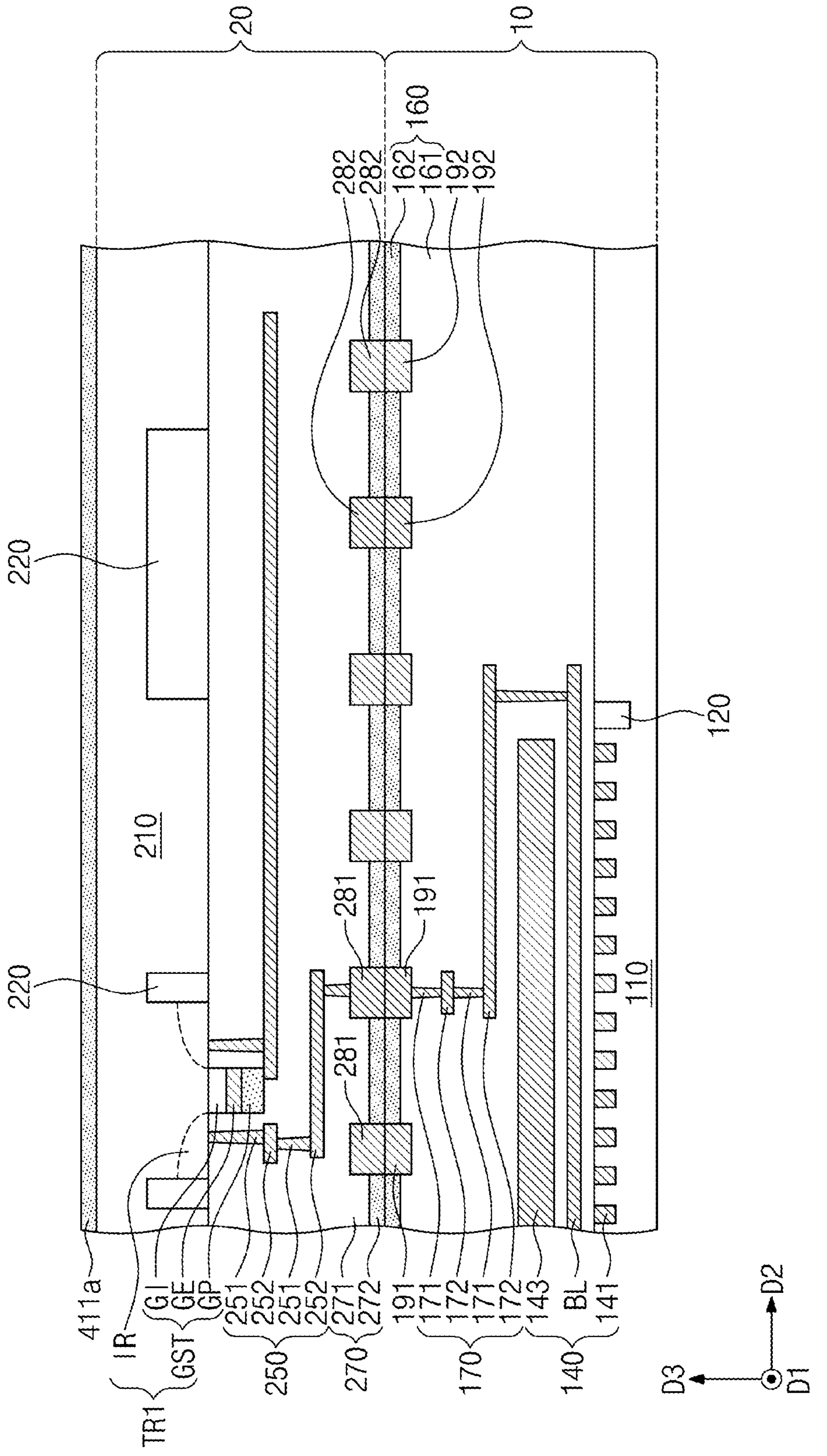
FIGS. 6A and 6B illustrate cross-sectional views showing a method of fabricating a semiconductor device according to some embodiments.
Figure 6B:
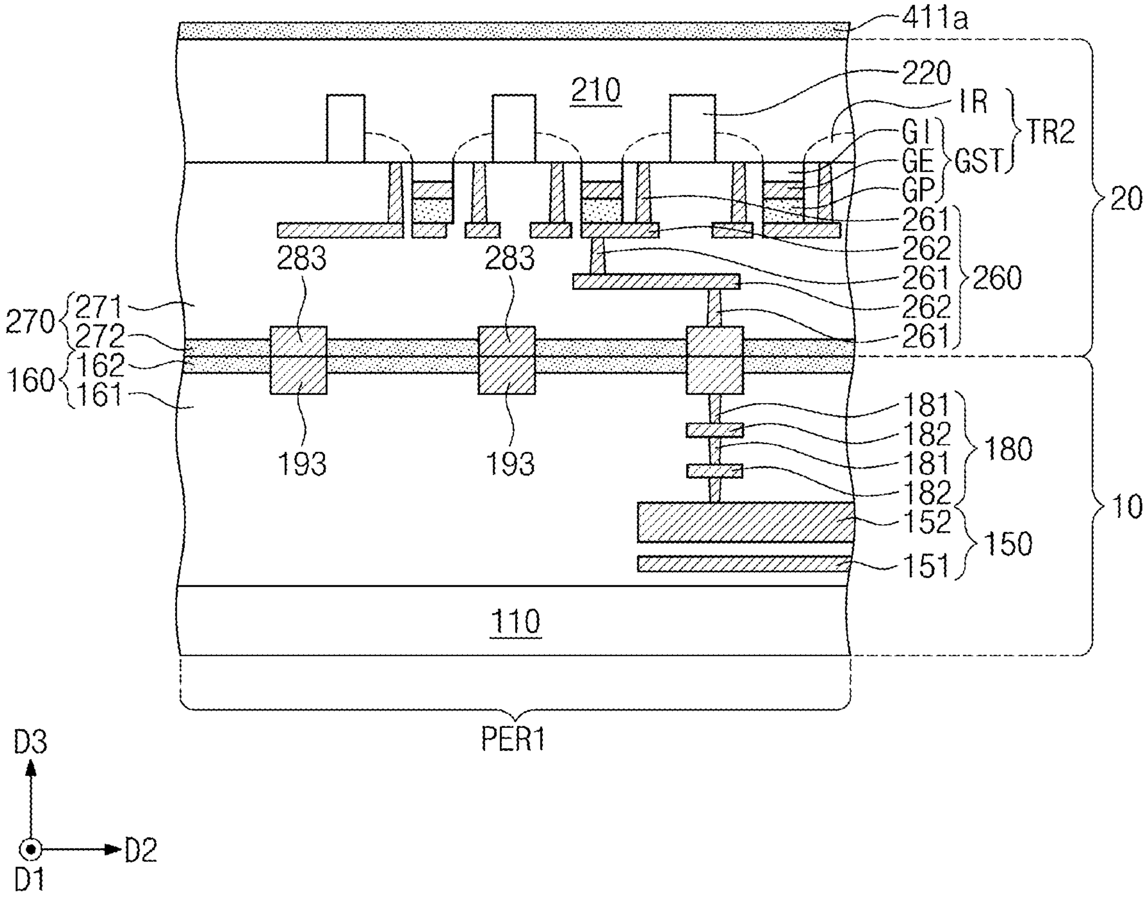

FIGS. 6A and 6B illustrate cross-sectional views showing a method of fabricating a semiconductor device according to some embodiments.

Referring to FIGS. 6A and 6B, an upper bonding structure 20 including first and second transistors TR1 and TR2 may be bonded onto a lower bonding structure 10 including a memory cell structure 140 and a power capacitor structure 150.

A first connection dielectric layer 411*a* may be formed on an upper substrate 210.

Referring to FIGS. 5A and 5B, first and second through vias 310*a* and 320*a* and first and second through dielectric layers 311*a* and 321*a* may be formed to penetrate the first connection dielectric layer 411*a* and the upper substrate 210. The formation of the first and second through vias 310*a* and 320*a* and the first and second through dielectric layers 311*a* and 321*a* may include forming a first through hole and a second through hole to penetrate the first connection dielectric layer 411*a* and the upper substrate 210, filling the first through hole with the first through dielectric layer 311*a* and the first through via 310*a*, and filling the second through hole with the second through dielectric layer 321*a* and the second through via 320*a*.

Other configurations of the connection structure 30 may be formed on the first connection dielectric layer 411*a*.

Figure 7:
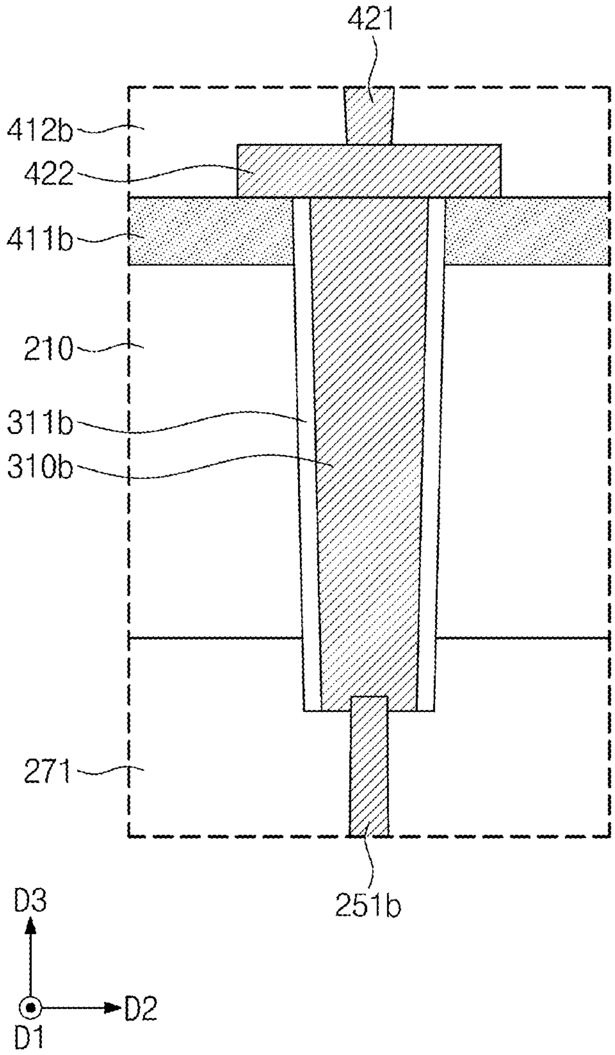
FIG. 7 illustrates an enlarged cross-sectional view showing a semiconductor device according to some embodiments.

FIG. 7 illustrates an enlarged cross-sectional view showing a semiconductor device according to some embodiments.

Referring to FIG. 7, a first through via 310*b* and a first upper contact 251*b* may be in contact with each other. The first upper contact 251*b* may penetrate a bottom surface of the first through via 310*b*. A lower portion of the first through via 310*b* may surround an upper portion of the first upper contact 251*b*. The upper portion of the first upper contact 251*b* may be provided in the lower portion of the first through via 310*b*. The upper portion of the first upper contact 251*b* may be surrounded by a lower portion of a first through dielectric layer 311*b*.

The first through via 310*b* and the first through dielectric layer 311*b* may each have a width that decreases as a level of the first through via 310*b* and the first through dielectric layer 311*b* becomes lower. The first upper contact 251*b* may have a width that decreases as a level is raised. The first through via 310*b* and the first through dielectric layer 311*b* may penetrate the upper substrate 210 and a first connection dielectric layer 411*b* on the upper substrate 210. A second connection dielectric layer 412*b* may be provided on the first connection dielectric layer 411*b*.

Figure 8:
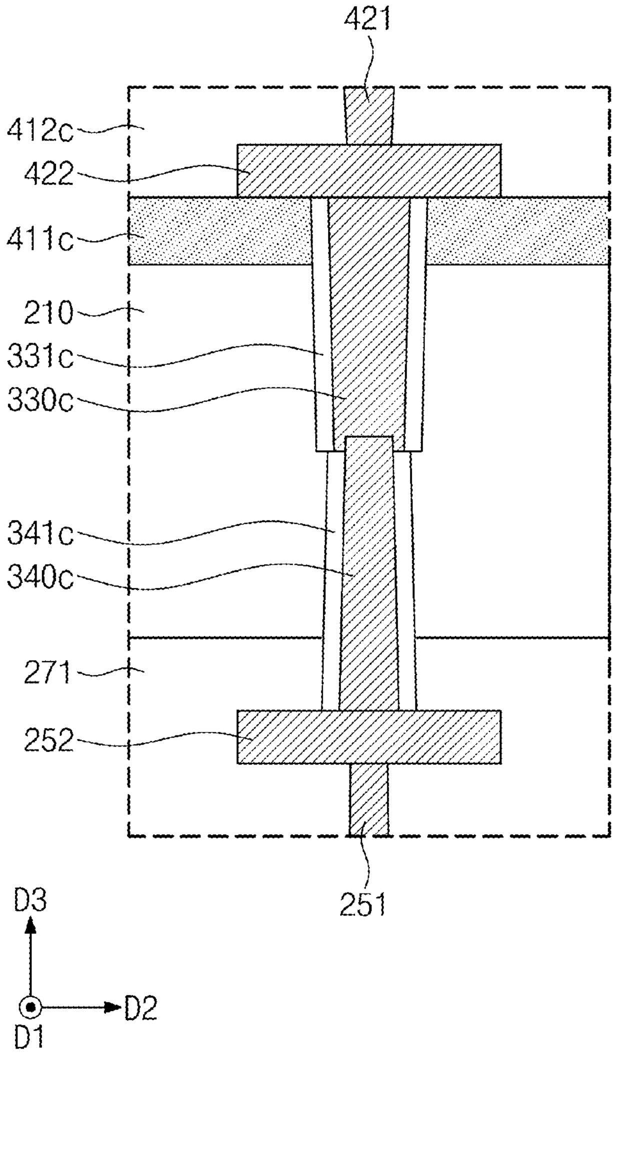
FIG. 8 illustrates an enlarged cross-sectional view showing a semiconductor device according to some embodiments.

FIG. 8 illustrates an enlarged cross-sectional view showing a semiconductor device according to some embodiments.

Referring to FIG. 8, a semiconductor device may include a first connection via 330*c* in contact with the bottom surface of the first connection conductive line 422 and a second connection via 340*c* in contact with the top surface of the first upper conductive line 252. A first connection via dielectric layer 331*c* may be provided to surround the first connection via 330*c*, and a second connection via dielectric layer 341*c* may be provided to surround the second connection via 340*c*.

The first connection via 330*c* and the first connection through dielectric layer 331*c* may each have a width that decreases as a level of the first connection via 331*c* and the first connection through dielectric layer 331*c* becomes lower. A lowermost portion of the first connection via 330*c* may be provided in the upper substrate 210. The lowermost portion of the first connection via 330*c* may be disposed between the top and bottom surfaces of the upper substrate 210. The second connection via 340*c* and the second connection via dielectric layer 341*c* may each have a width that increased as a level of the second connection via 340*c* and the second connection via dielectric layer 341*c* becomes lower. An uppermost portion of the second connection via 340*c* may be provided in the upper substrate 210. The uppermost portion of the second connection via 340*c* may be disposed between the top and bottom surfaces of the upper substrate 210.

The first connection via 330*c* and the second connection via 340*c* may be in contact with each other. The second connection via 340*c* may penetrate a bottom surface of the first connection via 330*c*. A lower portion of the first connection via 330*c* may surround an upper portion of the second connection via 340*c*. The upper portion of the second connection via 340*c* may be provided in the lower portion of the first connection via 330*c*. The second connection via dielectric layer 341*c* may have a top surface in contact with the bottom surface of the first connection via 330*c* and a bottom surface of the first connection via dielectric layer 331*c*.

The first connection via 330*c* and the first connection via dielectric layer 331*c* may penetrate a first connection dielectric layer 411*c* of the upper substrate 210. A second connection dielectric layer 412*c* may be provided on the first connection dielectric layer 411*c*.

Figure 9:
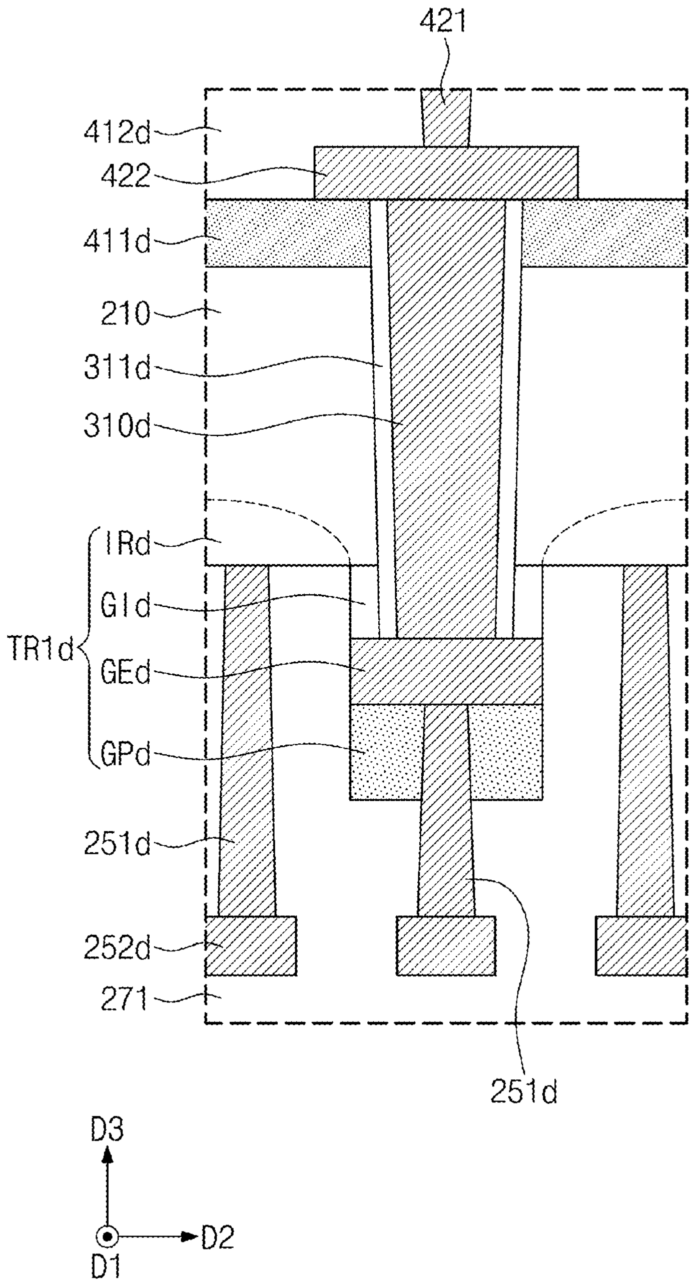
FIG. 9 illustrates an enlarged cross-sectional view showing a semiconductor device according to some embodiments.

FIG. 9 illustrates an enlarged cross-sectional view showing a semiconductor device according to some embodiments.

Referring to FIG. 9, a semiconductor device may include a first transistor TR1*d* on the upper substrate 210. The first transistor TR1*d* may include impurity regions IRd, a gate dielectric layer GId, a gate electrode GEd, and a gate capping layer GPd.

A first through via 310*d* may be connected to the gate electrode GEd. The first through via 310*d* and a first through dielectric layer 311*d* may have their bottom surfaces in contact with a top surface of the gate electrode GEd. The first through via 310*d* and the first through dielectric layer 311*d* may penetrate a first connection dielectric layer 411*d*, the upper substrate 210, and the gate dielectric layer GId. A second connection dielectric layer 412*d* may be provided on the first connection dielectric layer 411*d*.

A first upper contact 251*d* may be connected to the first transistor TR1*d*. The first upper contact 251*d* may be connected to the gate electrode GEd or the impurity region IRd. The first upper contact 251*d* may have a top surface in contact with a bottom surface of the gate electrode GEd or a bottom surface of the impurity region IRd. The first upper contact 251*d* connected to the gate electrode GEd may penetrate the gate capping layer GPd. A first upper conductive line 252*d* may be electrically connected through the first upper contact 251*d* to either the gate electrode GEd or the impurity region IRd.

Figure 10:
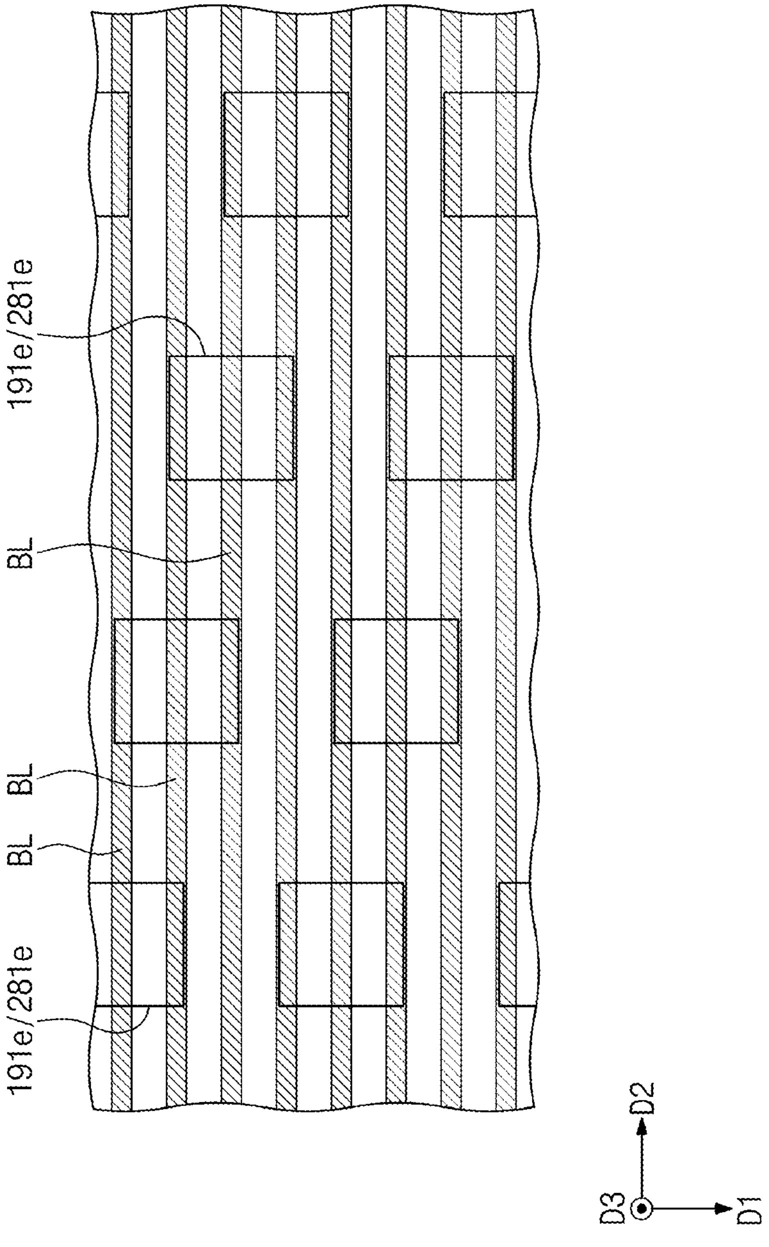
FIG. 10 illustrates a plan view showing an arrangement of bonding pads in a semiconductor device according to some embodiments.

FIG. 10 illustrates a plan view showing bit lines and bonding pads of a semiconductor device according to some embodiments.

Referring to FIG. 10, in a semiconductor device, a first upper bonding pad 281*e* and a first lower bonding pad 191*e* may overlap in the third direction D3 with the bit lines BL. For example, the first upper bonding pad 281*e* may overlap in the third direction D3 with three bit lines BL. The first upper bonding pad 281*e* and the first lower bonding pad 191*e* may each have a tetragonal shape when viewed in plan.

The first upper bonding pads 281*e* that are adjacent in the second direction D2 may partially overlap each other in the second direction D2. The first upper bonding pads 281*e* that are adjacent in the second direction D2 may have their sidewalls parallel to the second direction D2. The sidewalls of the first upper bonding pads 281*e* may not be disposed on a straight line that extends in the second direction D2. The first upper bonding pads 281*e* that are adjacent in the second direction D2 may be disposed to be offset from each other in the first direction D1. For example, the first upper bonding pads 281*e* that are adjacent in the second direction D2 may be offset in the first direction D1 as much as a pitch in the first direction D1 of the bit lines BL.

An arrangement of the first lower bonding pads 191*e* may be similar to that of the first upper bonding pads 281*e*.

Figure 11:
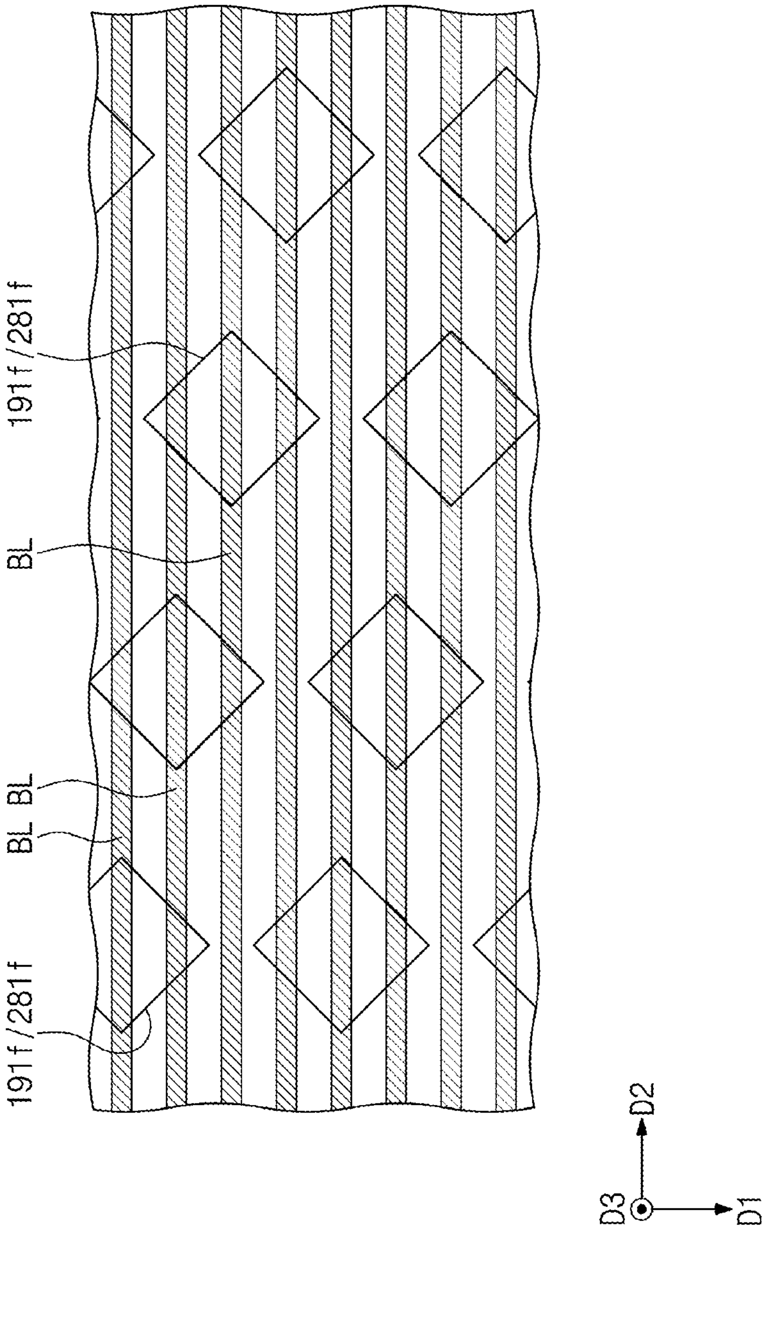
FIG. 11 illustrates a plan view showing an arrangement of bonding pads in a semiconductor device according to some embodiments.

FIG. 11 illustrates a plan view showing bit lines and bonding pads of a semiconductor device according to some embodiments.

Referring to FIG. 11, a first upper bonding pad 281*f* and a first lower bonding pad 191*f* of a semiconductor device may overlap in the third direction D3 with the bit lines BL. For example, the first upper bonding pad 281*f* may overlap in the third direction D3 with three bit lines BL. The first upper bonding pad 281*f* and the first lower bonding pad 191*f* may each have a rhombic shape when viewed in a plan view. The first upper bonding pad 281*f* and the first lower bonding pad 191*f* may have their sidewalls that intersect the first direction D1 and the second direction D2.

The first upper bonding pads 281*f* that are adjacent in the second direction D2 may be disposed offset from each other in the first direction D1. For example, the first upper bonding pads 281*f* that are adjacent in the second direction D2 may be offset in the first direction D1 as much as a pitch in the first direction D1 of the bit lines BL. An arrangement of the first lower bonding pads 191*f* may be similar to that of the first upper bonding pads 281*f*.

Figure 12:
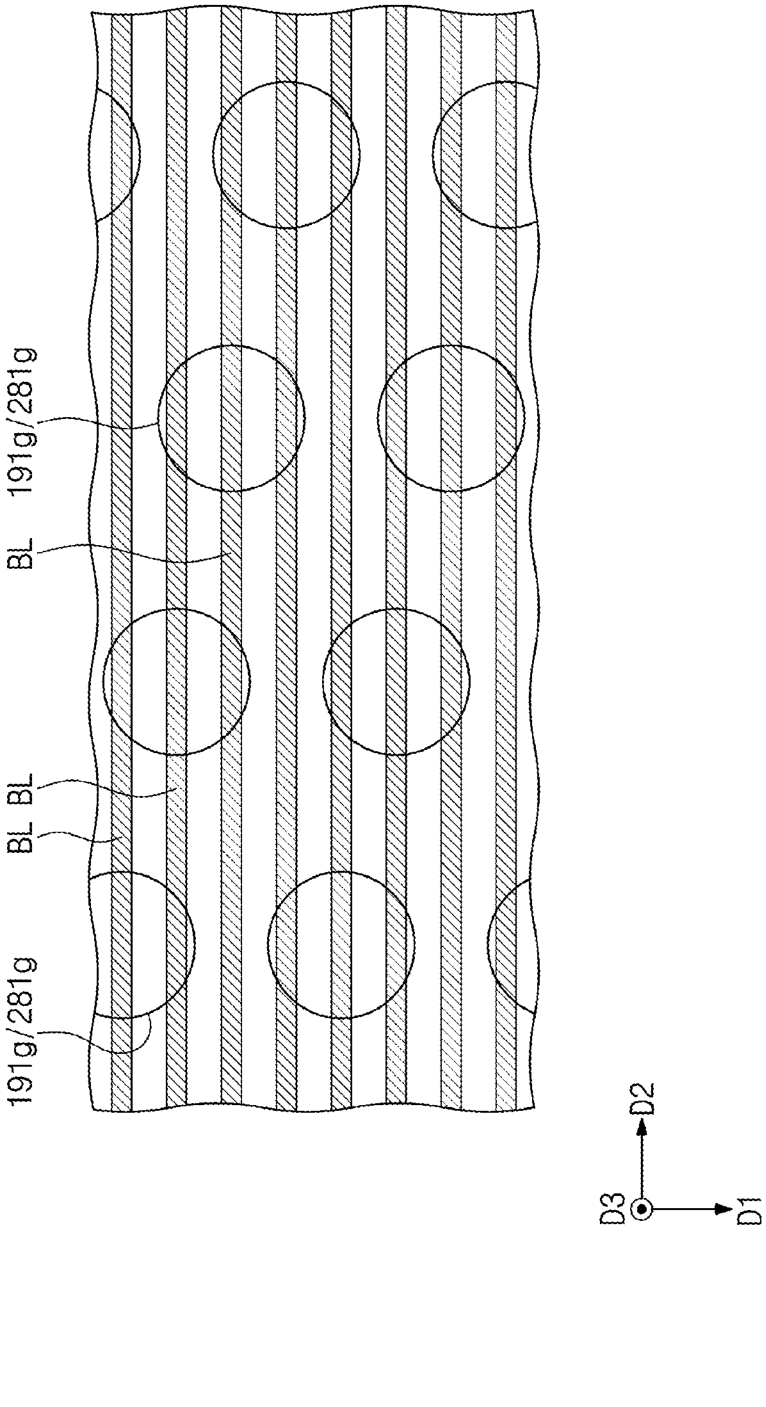
FIG. 12 illustrates a plan view showing an arrangement of bonding pads in a semiconductor device according to some embodiments.

FIG. 12 illustrates a plan view showing bit lines and bonding pads of a semiconductor device according to some embodiments.

Referring to FIG. 12, a first upper bonding pad 281*g* and a first lower bonding pad 191*g* of a semiconductor device may overlap in the third direction D3 with the bit lines BL. For example, the first upper bonding pad 281*g* may overlap in the third direction D3 with three bit lines BL. The first upper bonding pad 281*g* and the first lower bonding pad 191*g* may each have a circular shape when viewed in a plan view.

The first upper bonding pads 281*g* that are adjacent in the second direction D2 may be disposed offset from each other in the first direction D1. For example, the first upper bonding pads 281*g* that are adjacent in the second direction D2 may be offset in the first direction D1 as much as a pitch in the first direction D1 of the bit lines BL. An arrangement of the first lower bonding pads 191*g* may be similar to that of the first upper bonding pads 281*g*.

Figure 13:
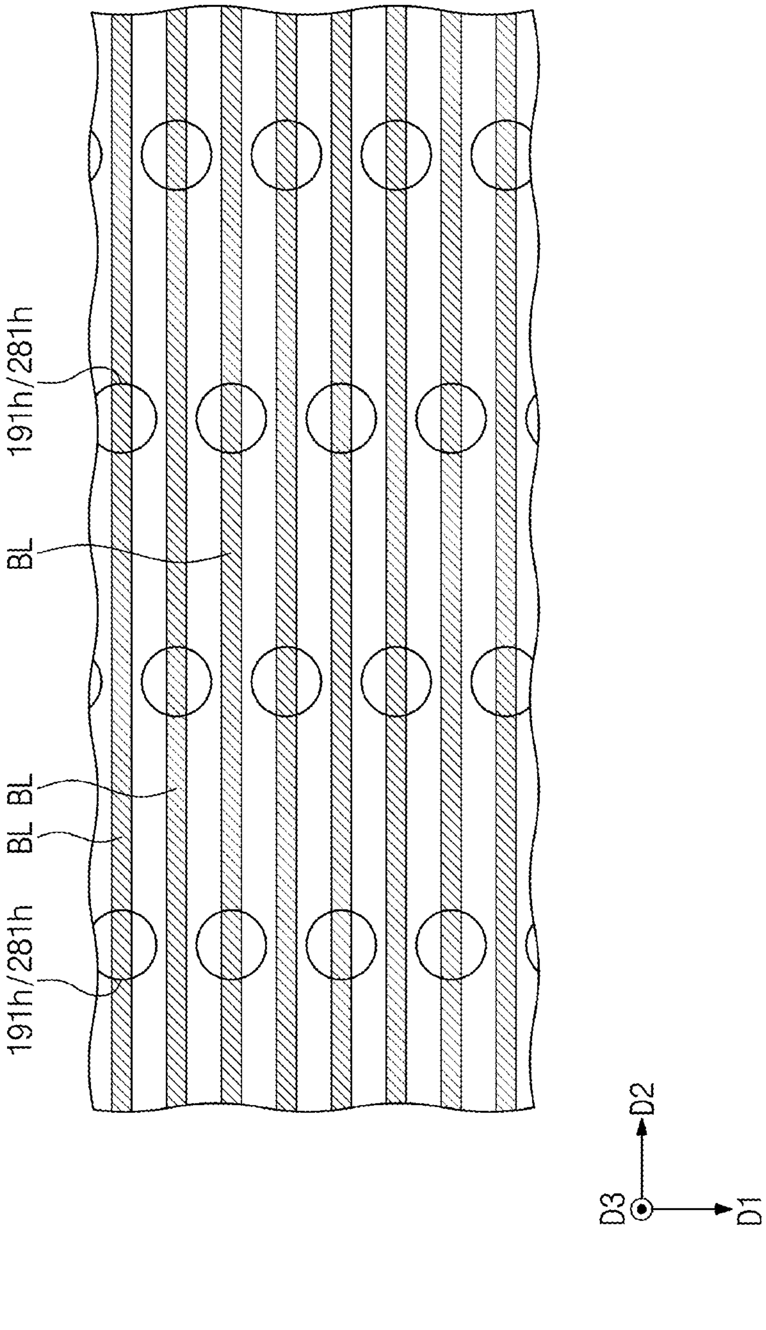
FIG. 13 illustrates a plan view showing an arrangement of bonding pads in a semiconductor device according to some embodiments.

FIG. 13 illustrates a plan view showing bit lines and bonding pads of a semiconductor device according to some embodiments.

Referring to FIG. 13, a first upper bonding pad 281*h* and a first lower bonding pad 191*h* of a semiconductor device may overlap in the third direction D3 with the bit lines BL. For example, one first upper bonding pad 281*h* may overlap in the third direction D3 with one bit line BL. The first upper bonding pad 281*h* and the first lower bonding pad 191*h* may each have a circular shape when viewed in a plan view.

The first upper bonding pads 281*h* that are adjacent in the second direction D2 may be disposed offset from each other in the first direction D1. For example, the first upper bonding pads 281*h* that are adjacent in the second direction D2 may be offset in the first direction D1 as much as a pitch in the first direction D1 of the bit lines BL. An arrangement of the first lower bonding pads 191*h* may be similar to that of the first upper bonding pads 281*h*.

Figure 14:
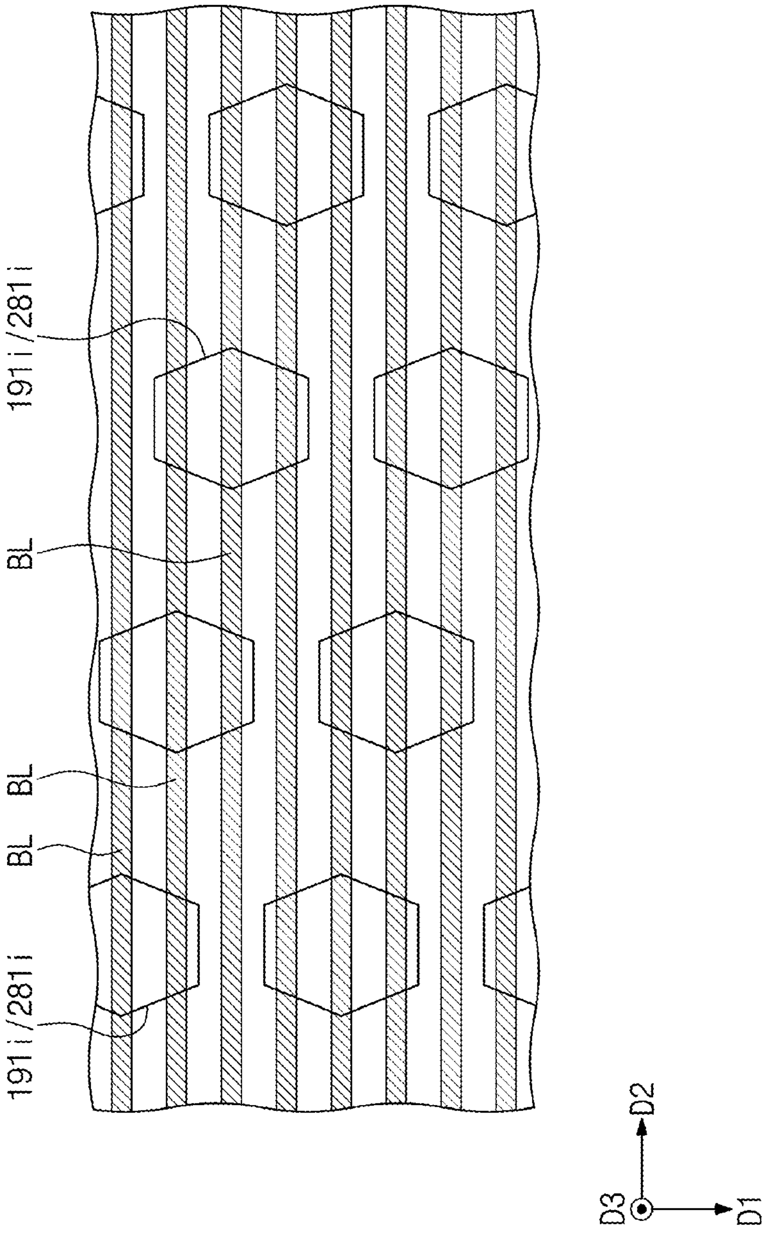
FIG. 14 illustrates a plan view showing an arrangement of bonding pads in a semiconductor device according to some embodiments.

FIG. 14 illustrates a plan view showing bit lines and bonding pads of a semiconductor device according to some embodiments.

Referring to FIG. 14, a first upper bonding pad 281*i* and a first lower bonding pad 191*i* of a semiconductor device may overlap in the third direction D3 with the bit lines BL. For example, the first upper bonding pad 281*i* may overlap in the third direction D3 with three bit lines BL. The first upper bonding pad 281*i* and the first lower bonding pad 191*i* may each have a hexagonal shape when viewed in plan.

The first upper bonding pads 281*i* that are adjacent in the second direction D2 may be disposed offset from each other in the first direction D1. For example, the first upper bonding pads 281*i* that are adjacent in the second direction D2 may be offset in the first direction D1 as much as a pitch in the first direction D1 of the bit lines BL. An arrangement of the first lower bonding pads 191*i* may be similar to that of the first upper bonding pads 281*i*.

Figure 15:
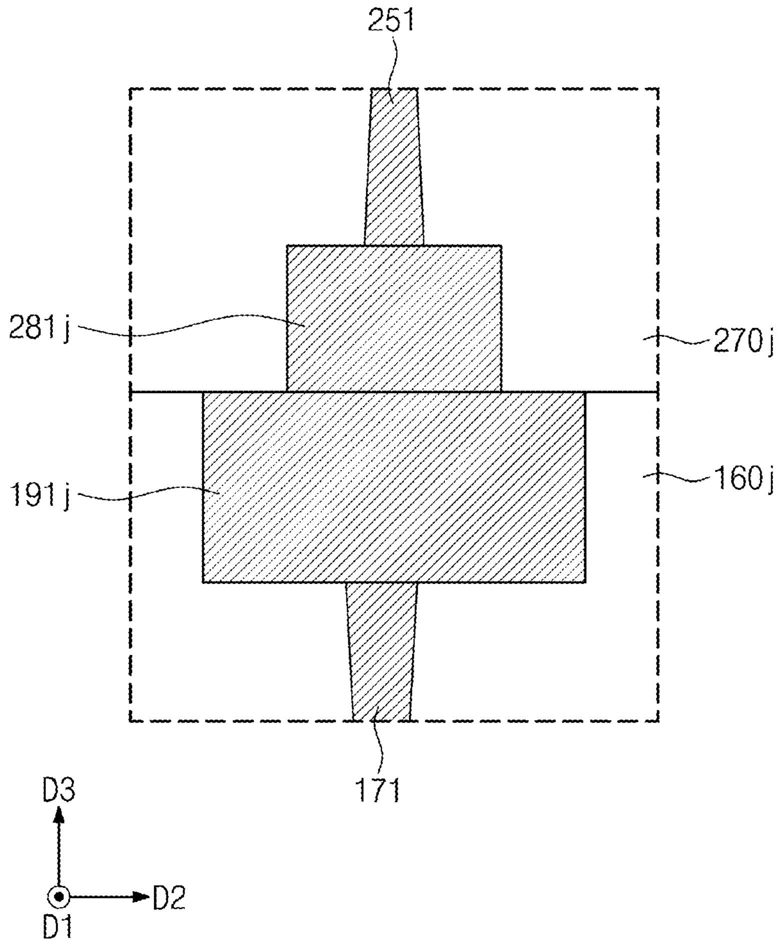
FIG. 15 illustrates an enlarged cross-sectional view showing a semiconductor device according to some embodiments.

FIG. 15 illustrates an enlarged cross-sectional view showing a semiconductor device according to some embodiments.

Referring to FIG. 15, a lower dielectric structure 160*j* and an upper dielectric structure 270*j* of a semiconductor device may include the same dielectric material. For example, the lower dielectric structure 160*j* and the upper dielectric structure 270*j* may include a $SiO_2$ layer.

A first lower bonding pad 191*j* may have a width that is greater than that of a first upper bonding pad 281*j*. The first lower bonding pad 191*j* may have a top surface in contact with a bottom surface of the upper dielectric structure 270*j*.

Figure 16:
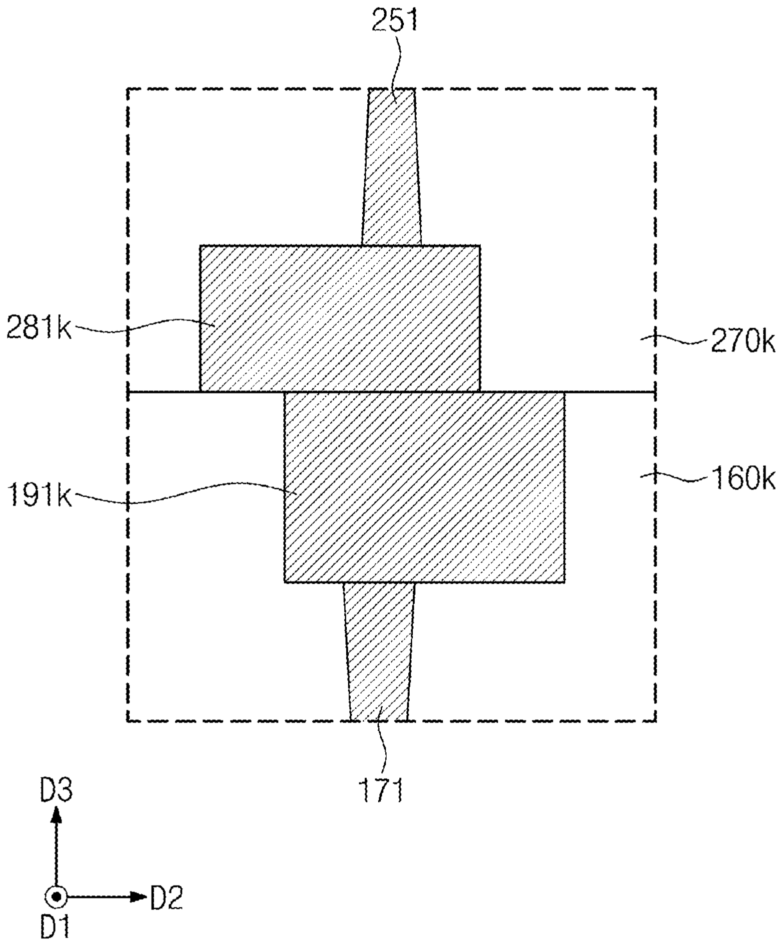
FIG. 16 illustrates an enlarged cross-sectional view showing a semiconductor device according to some embodiments.

FIG. 16 illustrates an enlarged cross-sectional view showing a semiconductor device according to some embodiments.

Referring to FIG. 16, a lower dielectric structure 160*k* and an upper dielectric structure 270*k* of a semiconductor device may include the same dielectric material. For example, the lower dielectric structure 160*k* and the upper dielectric structure 270*k* may include a $SiO_2$ layer.

A first lower bonding pad 191*k* may have a top surface in contact with a bottom surface of a first upper bonding pad 281*k* and a bottom surface of the upper dielectric structure 270*k*. The bottom surface of the first upper bonding pad 281*k* may be in contact with a top surface of the lower dielectric structure 160*k*.

Figure 17:
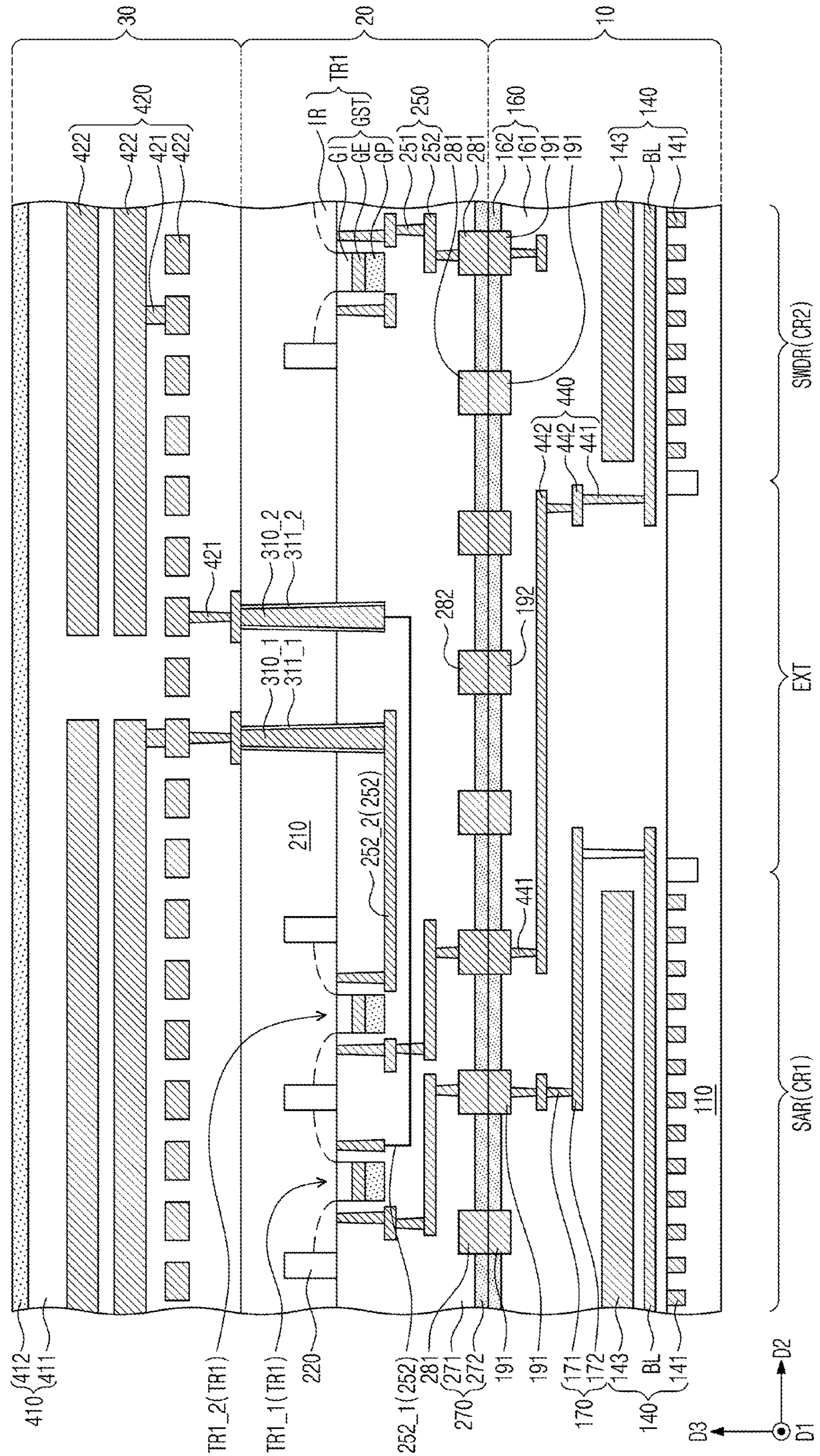
FIG. 17 illustrates a cross-sectional view showing a semiconductor device according to some embodiments.

FIG. 17 illustrates a cross-sectional view showing a semiconductor device according to some embodiments.

Referring to FIG. 17, a semiconductor device may include a first cell region CR1, a second cell region CR2, and an extension region EXT between the first and second cell regions CR1 and CR2. A sub-word line driver region SWDR of the second cell region CR2, the extension region EXT, and a sense amplifier region SAR of the first cell region CR1 may be arranged in the second direction D2.

The first transistors TR1 may be disposed on the first and second cell regions CR1 and CR2. The memory cell structures 140 may be disposed on the first and second cell regions CR1 and CR2. The first transistors TR1 may include a first connection transistor TR1_1 and a second connection transistor TR1_2. The first connection transistor TR1_1 and the second connection transistor TR1_2 may be disposed on the first cell region CR1. The first connection transistor TR1_1 and the second connection transistor TR1_2 may overlap in the third direction D3 with the memory cell structure 140 of the first cell region CR1. The first connection transistor TR1_1 may be electrically connected to the bit line BL of the first cell region CR1. The second connection transistor TR1_2 may be electrically connected to the bit line BL of the second cell region CR2.

The semiconductor device may further include region connection conductive structures 440 that electrically connect the second connection transistor TR1_2 to the bit line BL of the second cell region CR2. The region connection conductive structures 440 may include region connection contacts 441 and region connection conductive lines 442. The bit line BL of the second cell region CR2 may be electrically connected to the second connection transistor TR1_2 of the first cell region CR1 through the region connection contact 441, the region connection conductive line 442, the first lower bonding pad 191, the first upper bonding pad 281, the first upper contact 251, and the first upper conductive line 252. At least one of the region connection conductive lines 442 may extend from the extension region EXT toward the first cell region CR1.

In some embodiments, the bit line BL of the second cell region CR2 may be a complementary bit line. In some embodiments, the first upper bonding pad 281 and the first lower bonding pad 191 that are electrically connected to the bit line BL of the first cell region CR1 may be disposed farther away from the extension region EXT than the first upper bonding pad 281 and the first lower bonding pad 191 that are electrically connected to the bit line BL of the second cell region CR2. In some embodiments, the first upper bonding pad 281 and the first lower bonding pad 191 that are electrically connected to the bit line BL of the first cell region CR1 may be alternately disposed (e.g., in the second direction D2) with the first upper bonding pad 281 and the first lower bonding pad 191 that are electrically connected to the bit line BL of the second cell region CR2.

In some embodiments, a pitch in the first direction D1 of the first upper conductive lines 252 may be less than a pitch in the first direction D1 of the first upper bonding pads 281.

A first transistor connection via 310_1 and a second transistor connection via 310_2 may be provided to penetrate the upper substrate 210. A first dielectric layer 311_1 may be provided to surround the first transistor connection via 310_1. A second dielectric layer 311_2 may be provided to surround the second transistor connection via 310_2.

The first and second transistor connection vias 310_1 and 310_2 may be connected to a connection conductive structure 420. The first and second transistor connection vias 310_1 and 310_2 may each have a width that increases as a level of the first and second transistor connection vias 310_1 and 310_2 becomes lower. The first upper conductive lines 252 may include a first transistor connection line 252_1 and a second transistor connection line 252_2. The first transistor connection line 252_1 may electrically connect the second transistor connection via 310_2 to the first connection transistor TR1_1. The second transistor connection line 252_2 may electrically connect the first transistor connection via 310_1 to the second connection transistor TR1_2. The first transistor connection line 252_1 is illustrated as a solid line for convenience of description, but a shape and placement of the first transistor connection line 252_1 may be similar to that of the second transistor connection line 252_2.

Figure 18A:
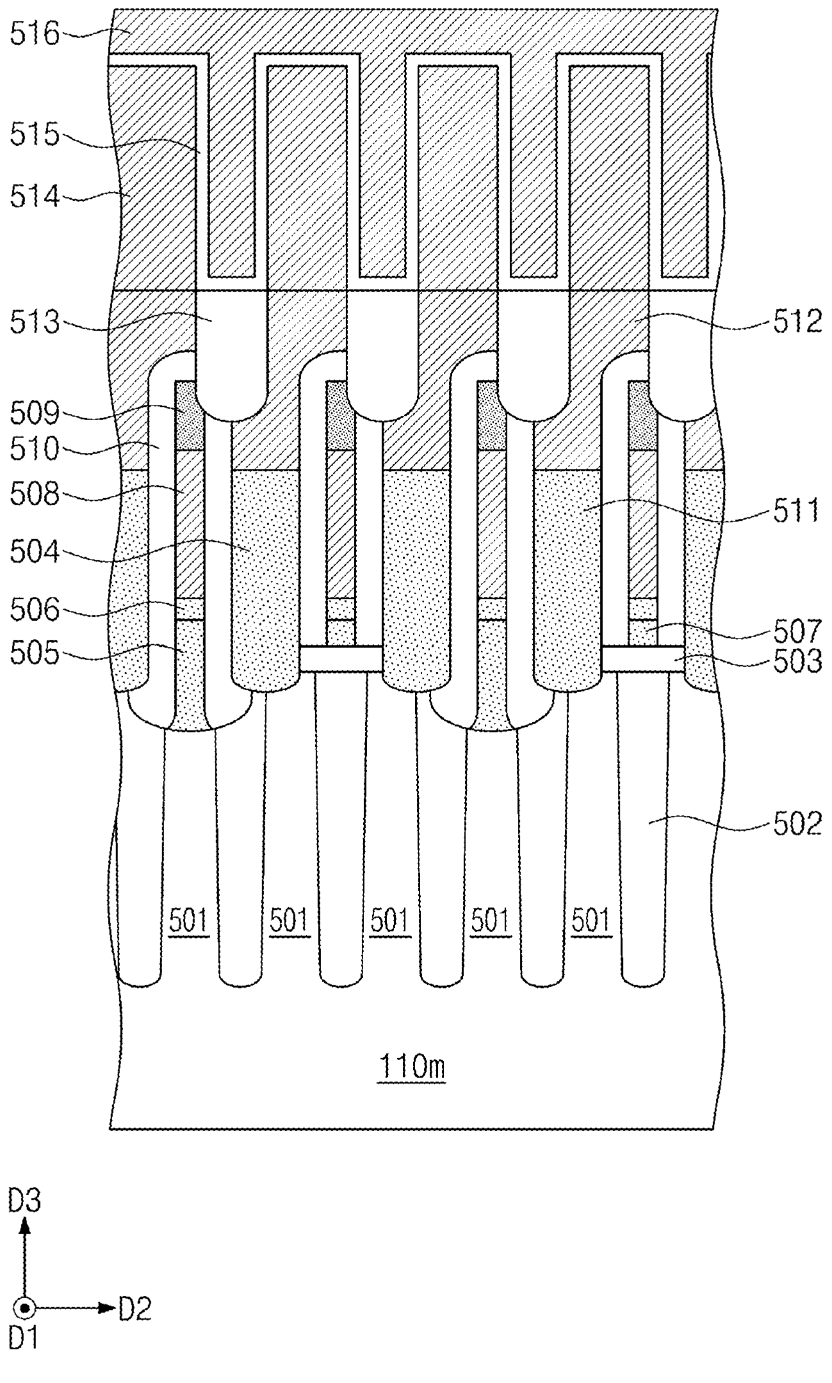
FIGS. 18A and 18B illustrate cross-sectional views showing a memory cell structure according to some embodiments.
Figure 18B:
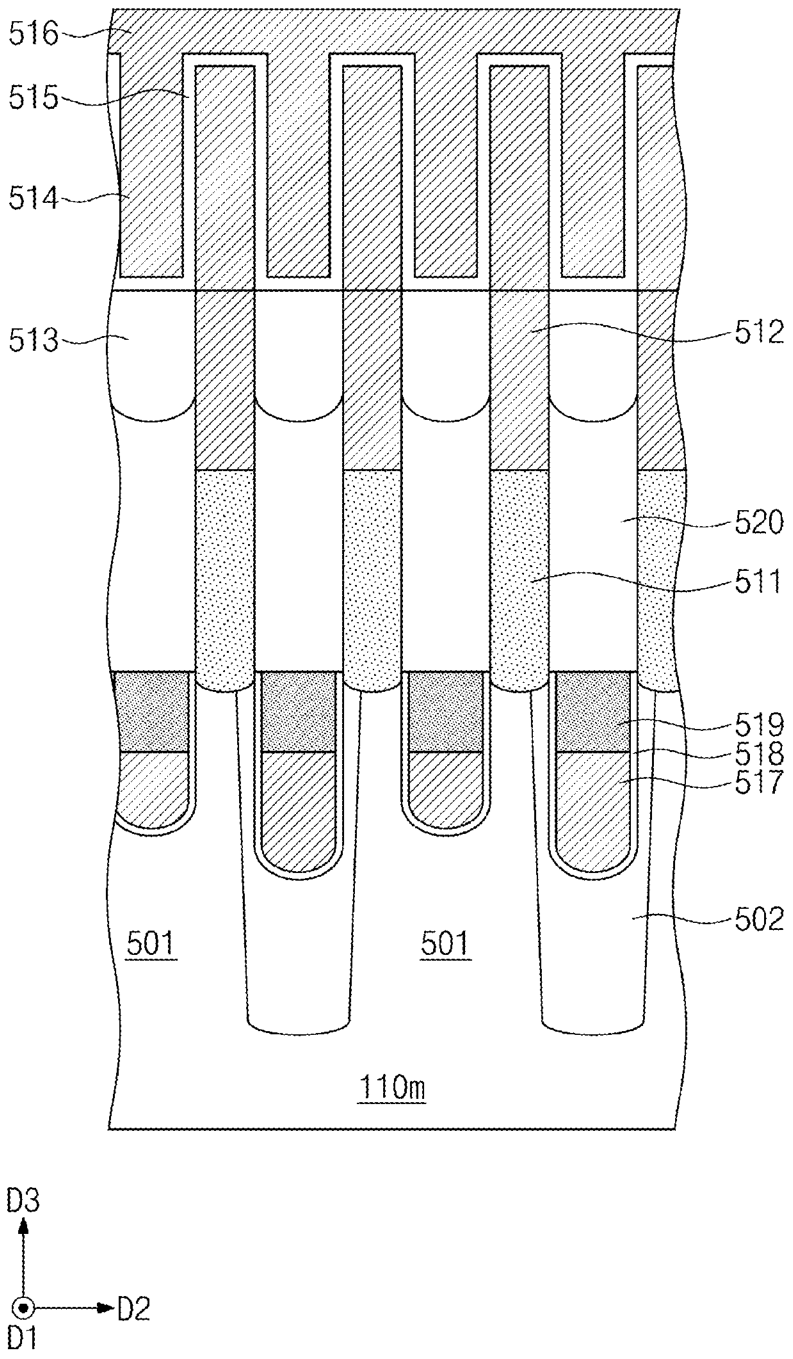

FIGS. 18A and 18B illustrate cross-sectional views showing a memory cell structure according to some embodiments.

Referring to FIGS. 18A and 18B, a memory cell structure may be provided that is connected to a lower substrate 110*m*. The memory cell structure may include active patterns 501, cell device isolation layers 502, cell dielectric layers 503, bit-line contacts 505, first conductive layers 507, second conductive layers 506, third conductive layers 508, bit-line capping layers 509, bit-line spacers 510, node contacts 511, landing pads 512, a landing pad isolation layer 513, first cell capacitor electrodes 514, a cell capacitor dielectric layer 515, a second cell capacitor electrode 516, cell gate electrodes 517, cell gate dielectric layers 518, cell gate capping layers 519, and dielectric fences 520.

The active patterns 501 may be defined to indicate upper portions of the lower substrate 110*m* that protrude in the third direction D3. The active patterns 501 may be spaced apart from each other.

The cell device isolation layers 502 may be provided in a space between the active patterns 501. The cell device isolation layers 502 may be provided in the lower substrate 110*m*. The active patterns 501 may be defined by the cell device isolation layers 502. The cell device isolation layer 502 may include a dielectric material.

A gate structure may be provided which includes the cell gate electrode 517, the cell gate dielectric layer 518, and the cell gate capping layer 519. The gate structure may extend in the first direction D1. The gate structures may be arranged in the second direction D2. The gate structure may be a buried gate structure that is buried in the active patterns 501 and the cell device isolation layer 502. The cell gate dielectric layer 518 and the cell gate capping layer 519 may include a dielectric material. The cell gate electrode 517 may include a conductive material.

The cell dielectric layers 503 may be provided on the gate structures and the cell device isolation layers 502. The cell dielectric layer 503 may include a dielectric material. In some embodiments, the cell dielectric layer 503 may include a plurality of dielectric layers.

Bit-line structures may be provided that extend in the second direction D2. The bit-line structures may be arranged in the first direction D1. The bit-line structure may include bit-line contacts 505, first conductive layers 507, a second conductive layer 506, a third conductive layer 508, a bit-line capping layer 509, and a bit-line spacer 510.

The bit-line contacts 505 and the first conductive layers 507 of the bit-line structure may be alternately disposed along the second direction D2. The bit-line contact 505 may be connected to the active pattern 501. The first conductive layer 507 may be provided on the cell dielectric layer 503. In some embodiments, the bit-line contacts 505 and the first conductive layers 507 included in one bit-line structure may be connected into a single unitary structure with no boundary therebetween.

The second conductive layer 506 may be provided on the bit-line contacts 505 and the first conductive layers 507. The third conductive layer 508 may be provided on the second conductive layer 506. The bit-line capping layer 509 may be provided on the third conductive layer 508. A conductive material may be included in the bit-line contact 505, the first conductive layer 507, the second conductive layer 506, and the third conductive layer 508. The bit-line capping layer 509 may include a dielectric material.

The bit-line spacer 510 may cover a top surface and a sidewall of the bit-line capping layer 509, sidewalls of the first, second, and third conductive layers 507, 506, and 508, and sidewalls of the bit-line contacts 505. The bit-line spacer 510 may include a dielectric material. In some embodiments, the bit-line spacer 510 may include a plurality of dielectric layers.

The node contact 511 may be connected to the active pattern 501. The node contact 511 may be provided between neighboring bit-line structures. The node contact 511 may include a conductive material. For example, the node contact 511 may include polysilicon.

The landing pad 512 may be provided on the node contact 511. The landing pad 512 may include a conductive material. In some embodiments, a metal silicide layer and a barrier layer may be provided between the node contact 511 and the landing pad 512.

The dielectric fence 520 may be provided on the cell gate capping layer 519. The dielectric fence 520 may be provided between the node contacts 511 that are adjacent to each other in the second direction D2. The dielectric fence 520 may include a dielectric material.

The landing pad isolation layer 513 may be provided on the dielectric fence 520. The landing pad isolation layer 513 may separate the landing pads 512 from each other. The landing pad isolation layer 513 may surround the landing pad 512. The landing pad isolation layer 513 may include a dielectric material.

A cell capacitor may be constituted by the first cell capacitor electrode 514, the cell capacitor dielectric layer 515, and the second cell capacitor electrode 516. The cell capacitor dielectric layer 515 may be provided between the first cell capacitor electrode 514 and the second cell capacitor electrode 516. The first and second cell capacitor electrodes 514 and 516 may include a conductive material. The cell capacitor dielectric layer 515 may include a dielectric material. A semiconductor device may be a dynamic random access memory (DRAM) including the cell capacitor.

In some embodiments, the memory cell structure may include a magnetic tunnel junction pattern instead of the cell capacitor. In this case, the semiconductor device may be a magnetic tunnel junction pattern (MRAM). In some embodiments, the memory cell structure may include a phase change material or a variable resistance material instead of the cell capacitor. In this case, the semiconductor device may be a phase change random access memory (PRAM) or a resistive random access memory (ReRAM). In some embodiments, various structures and/or materials capable of storing data may be provided instead of the cell capacitor.

In some embodiments, the memory cell structure may include a vertical channel transistor (VCT) in which a channel extends in the third direction D3.

By way of summation and review, embodiments provide a semiconductor device whose electrical properties are improved. In a semiconductor device according to some embodiments, as sense amplifiers overlap a memory cell structure, it may be possible to reduce a size of a unit sense amplifier, to decrease cost of fabrication for the sense amplifier, and to improve electrical properties of the sense amplifier.

Although some embodiments have been discussed with reference to accompanying figures, it will be understood that various changes in form and details may be made therein without departing from the spirit and scope thereof. It therefore will be understood that the embodiments described above are just illustrative but not limited in all aspects.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower substrate;
a lower dielectric structure on the lower substrate;
a memory cell structure between the lower substrate and the lower dielectric structure;
a lower bonding pad in the lower dielectric structure;
an upper dielectric structure on the lower dielectric structure;
an upper substrate on the upper dielectric structure;
a transistor between the upper substrate and the upper dielectric structure; and
an upper bonding pad in the upper dielectric structure,
wherein:
a top surface of the lower bonding pad is in contact with a bottom surface of the upper bonding pad, and
the lower bonding pad and the upper bonding pad overlap the memory cell structure,
wherein the memory cell structure includes a cell gate structure, a cell capacitor, and a bit line between the cell gate structure and the cell capacitor, and
wherein the upper bonding pad and the lower bonding pad overlap the bit line.

2. The semiconductor device as claimed in claim 1,
wherein the transistor constitutes a sense amplifier.

3. The semiconductor device as claimed in claim 1,
wherein the transistor overlaps the memory cell structure.

4. The semiconductor device as claimed in claim 1,
wherein the transistor and the memory cell structure are electrically connected through the lower bonding pad and the upper bonding pad.

5. The semiconductor device as claimed in claim 1,
wherein the semiconductor device further includes:
a lower conductive structure that connects the bit line to the lower bonding pad; and
an upper conductive structure that connects the transistor to the upper bonding pad.

6. The semiconductor device as claimed in claim 1,
wherein a bottom surface of the upper dielectric structure is bonded to a top surface of the lower dielectric structure.

7. The semiconductor device as claimed in claim 1,
wherein a level of the memory cell structure is lower than a level of the upper bonding pad and a level of the lower bonding pad.

8. The semiconductor device as claimed in claim 1, further comprising a through via that penetrates the upper substrate,
wherein the through via is electrically connected to the transistor.

9. A semiconductor device, comprising:
a lower bonding structure that includes a lower substrate, a lower dielectric structure on the lower substrate, a memory cell structure between the lower substrate and the lower dielectric structure, and a first lower bonding pad in the lower dielectric structure; and
an upper bonding structure that includes an upper dielectric structure on the lower dielectric structure, an upper substrate on the upper dielectric structure, a first transistor between the upper substrate and the upper dielectric structure, and a first upper bonding pad in the upper dielectric structure,
wherein the first lower bonding pad is in contact with the first upper bonding pad,
wherein the first transistor overlaps the memory cell structure,
wherein the first transistor is electrically connected to the memory cell structure through the first upper bonding pad and the first lower bonding pad, and
wherein the lower bonding structure includes:
a power capacitor between the lower substrate and the lower dielectric structure; and
a second lower bonding pad electrically connected to the power capacitor.

10. The semiconductor device as claimed in claim 9,
wherein the first upper bonding pad and the first lower bonding pad overlap the memory cell structure.

11. The semiconductor device as claimed in claim 9, wherein:
the memory cell structure includes a cell gate structure, a cell capacitor, and a bit line between the cell gate structure and the cell capacitor, and
the first upper bonding pad and the first lower bonding pad overlap the bit line.

12. The semiconductor device as claimed in claim 11,
wherein the first upper bonding pad and the first lower bonding pad overlap the cell gate structure and the cell capacitor.

13. The semiconductor device as claimed in claim 9, further comprising:
a connection structure that includes a connection dielectric structure on the upper substrate and a connection conductive structure in the connection dielectric structure; and
a through via that electrically connects the connection conductive structure to the first transistor,
wherein the through via penetrates the upper substrate.

14. The semiconductor device as claimed in claim 13,
wherein the upper bonding structure includes:
an upper contact connected to the first transistor; and
an upper conductive line that connects the upper contact to the through via.

15. The semiconductor device as claimed in claim 9,
wherein the upper bonding structure includes:
a second transistor between the upper substrate and the upper dielectric structure; and
a second upper bonding pad electrically connected to the second transistor, and
wherein the second lower bonding pad is in contact with the second upper bonding pad.

16. The semiconductor device as claimed in claim 15,
wherein the second upper bonding pad and the second lower bonding pad overlap the power capacitor.

17. The semiconductor device as claimed in claim 15,
wherein the memory cell structure includes a cell capacitor, and
wherein the cell capacitor is at a level the same as a level of the power capacitor.

18. The semiconductor device as claimed in claim 9,
wherein:
the memory cell structure includes bit lines that extend in a first direction and are arranged in a second direction that intersects the first direction, the first upper bonding pad includes two first upper bonding pads that are adjacent to each other in the first direction, and the two first upper bonding pads are offset in the second direction.

19. The semiconductor device as claimed in claim 18, wherein a pitch in the second direction of the bit lines is the same as an offset distance in the second direction between the two first upper bonding pads.

20. A semiconductor device, comprising:

a lower substrate;

a lower dielectric structure on the lower substrate;

a memory cell structure between the lower substrate and the lower dielectric structure, wherein the memory cell structure includes a bit line;

an upper dielectric structure on the lower dielectric structure;

an upper substrate on the upper dielectric structure;

a transistor between the upper substrate and the upper dielectric structure;

a connection dielectric structure on the upper substrate;

a connection conductive structure in the connection dielectric structure;

a first lower bonding pad and an upper bonding pad that electrically connect the transistor to the bit line, wherein the first lower bonding pad and the upper bonding pad are in contact with each other;

a through via that electrically connects the transistor to the connection conductive structure;

a power capacitor between the lower substrate and the lower dielectric structure; and a second lower bonding pad electrically connected to the power capacitor, wherein the transistor, the upper bonding pad, and the first lower bonding pad overlap the memory cell structure, and wherein the through via penetrates the upper substrate.

* * * * *